United States Patent
Tsuchihashi

(10) Patent No.: US 8,968,988 B2
(45) Date of Patent: Mar. 3, 2015

(54) RESIST PATTERN FORMING METHOD, RESIST PATTERN, CROSSLINKABLE NEGATIVE RESIST COMPOSITION, NANOIMPRINT MOLD AND PHOTOMASK

(75) Inventor: Toru Tsuchihashi, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 13/561,498

(22) Filed: Jul. 30, 2012

(65) Prior Publication Data

US 2013/0052567 A1    Feb. 28, 2013

(30) Foreign Application Priority Data

Aug. 22, 2011    (JP) ................... 2011-180893

(51) Int. Cl.
| | | |
|---|---|---|
| G03F 7/26 | (2006.01) | |
| G03F 1/68 | (2012.01) | |
| C08F 12/18 | (2006.01) | |
| C08F 12/24 | (2006.01) | |
| C08F 12/26 | (2006.01) | |
| C08F 212/14 | (2006.01) | |
| G03F 7/00 | (2006.01) | |
| C08F 8/14 | (2006.01) | |
| G03F 7/038 | (2006.01) | |

(52) U.S. Cl.
CPC . *G03F 1/68* (2013.01); *C08F 12/18* (2013.01); *C08F 12/24* (2013.01); *C08F 12/26* (2013.01); *C08F 212/14* (2013.01); *G03F 7/0002* (2013.01); *C08F 8/14* (2013.01); *G03F 7/0382* (2013.01)
USPC ........................ 430/322; 430/270.1

(58) Field of Classification Search
CPC ... G03F 7/0045; G03F 7/0392; G03F 7/0382; G03F 7/0397; G03F 7/004; G03F 7/322; G03F 7/40; G03F 7/00; G03F 7/0395; G03F 7/30; G03F 7/70625; H01L 21/0274; H01L 21/0273; H01L 21/31144; H01L 21/312; H01L 21/32139; H01L 21/0337; H01L 21/0338
USPC .............................. 430/322, 270.1
See application file for complete search history.

(56) References Cited

U.S. PATENT DOCUMENTS

| | | | | |
|---|---|---|---|---|
| 4,197,000 | A * | 4/1980 | Blackwood ............... | 396/625 |
| 6,492,087 | B1 | 12/2002 | Brainard | |
| 2003/0165776 | A1 * | 9/2003 | Yasunami et al. ......... | 430/280.1 |
| 2006/0172224 | A1 | 8/2006 | Cameron et al. | |
| 2006/0177763 | A1 | 8/2006 | Matsuoka et al. | |
| 2008/0261149 | A1 * | 10/2008 | Asakawa et al. ........... | 430/270.1 |
| 2009/0035702 | A1 | 2/2009 | Matsuoka et al. | |
| 2010/0304301 | A1 | 12/2010 | Tanaka et al. | |

FOREIGN PATENT DOCUMENTS

| | | | |
|---|---|---|---|
| JP | 63-232430 A | | 9/1988 |
| JP | 2000-239538 A | | 9/2000 |
| JP | 2000-284503 | * | 10/2000 |
| JP | 2006-146242 A | | 6/2006 |
| JP | 2008-162101 A | | 7/2008 |
| JP | 2010-134240 A | | 6/2010 |
| JP | 2010276910 A | | 12/2010 |
| JP | 2011035173 A | | 2/2011 |
| KR | 10-2006-0003150 A | | 1/2006 |
| KR | 10-2008-0046478 A | | 5/2008 |
| WO | 2005/023880 A1 | | 3/2005 |
| WO | WO 2012/098822 | * | 7/2012 |

OTHER PUBLICATIONS

Office Action dated May 21, 2013 issued by the Japanese Patent Office in counterpart Japanese Application No. 2011-180893.
Office Action dated Jan. 13, 2014 issued by the Korean Intellectual Property Office in counterpart Korean Patent Application No. 10-2012-0083058.

* cited by examiner

*Primary Examiner* — Caleen Sullivan
(74) *Attorney, Agent, or Firm* — Sughrue Mion, PLLC

(57) ABSTRACT

A resist pattern forming method includes: in the following order, (1) a step of forming a film on a substrate by using a negative resist composition capable of undergoing negative conversion by a crosslinking reaction; (2) a step of exposing the film; and (4) a step of performing development by using an alkali developer after the exposing, wherein the negative resist composition contains (A) a polymer compound having a repeating unit represented by the following formula (I) as defined in the specification, a thickness of the film formed in the step (1) is from 15 to 40 nm, and an alkali component concentration in the alkali developer is from 0.5 to 1.1 mass %.

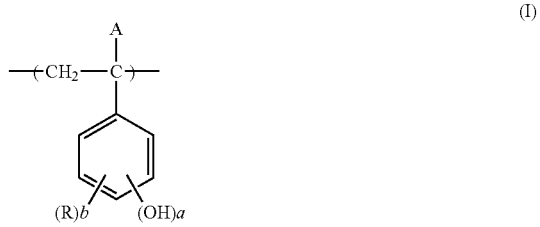

13 Claims, No Drawings

RESIST PATTERN FORMING METHOD, RESIST PATTERN, CROSSLINKABLE NEGATIVE RESIST COMPOSITION, NANOIMPRINT MOLD AND PHOTOMASK

BACKGROUND OF THE INVENTION

1. Field of the Invention

The present invention relates to a resist pattern forming method suitably usable in the ultramicrolithography process such as production of VLSI or a high-capacity microchip as well as in other photofabrication processes and capable of forming a highly defined pattern by using an electron beam (EB) or an extreme-ultraviolet ray (EUV), a resist pattern, a crosslinkable negative resist composition, a nanoimprint mold and a photomask. More specifically, the present invention relates to a resist pattern forming method for use in the process where a substrate with a specific underlying film is used, a resist pattern, a crosslinkable negative resist composition, a nanoimprint mold and a photomask.

The resist pattern forming method of the present invention can be also suitably used for the production method of a nanoimprint mold structure.

2. Description of the Related Art

In the microfabrication using a resist composition, with an increase in the integration degree of an integrated circuit, formation of an ultrafine pattern (for example, a 1:1 line-and-space pattern with a line width of 30 nm or less, that is, a repetition of lines of 30 nm or less and spaces of 30 nm or less) is recently required.

To meet this requirement, the exposure wavelength tends to become shorter, such as from g line to i line or further to excimer laser light and at present, development of a lithography technique using an extremely-ultraviolet light (EUV) or an electron beam is proceeding. In recent years, the resist composition is also used for an application to produce a mold for use in the so-called imprint process (for example, JP-A-2008-162101 (the term "JP-A" as used herein means an "unexamined published Japanese patent application") and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basic and Technology Development•Application Expansion of Nanoimprint—Base Technology of Nanoimprint and Latest Technology Expansion), Frontier Shuppan (issued on June, 2006)).

Furthermore, the progress in refinement of a pattern formed brings about a new problem of pattern collapse and in order to solve this problem, thinning of the resist film is being applied in combination.

As for the lithography technology using an extreme-ultraviolet light (EUV) or an electron beam or as for the resist composition used for an application to produce an imprint mold, those using a resin in which a hydrogen atom of a phenolic hydroxyl group is replaced by an acid-labile group such as acetal structure are disclosed in JP-A-2000-239538, JP-A-2006-146242 and International Publication No. 05/023880.

An aqueous 2.38 mass % tetramethylammonium hydroxide solution (hereinafter simply referred to as an aqueous TMAH solution) is in fact used as a standard developer in industry, but the above-described thinning of a resist film raises a problem such as disconnection of patterns and LER performance deterioration due to film loss of the resist film during development.

In order to solve this problem, there have been proposed, for example, a method where when developing a positive novolak resist, the pattern is developed with a 0.115 N to 0.15 N alkali developer (JP-A-63-232430), and a method where a resist film formed of a resist composition containing a resin having an ester-type acid-decomposable repeating unit is developed using an aqueous TMAH solution with a concentration of 1.2 mass % or less (JP-A-2010-134240).

SUMMARY OF THE INVENTION

However, for example, the resolution performance for an ultrafine pattern and good nanoedge roughness are not satisfied at present by any of the combinations of a resist composition and the like disclosed.

An object of the present invention is to provide a resist pattern forming method capable of, even in the formation of an ultrafine (for example, a 1:1 line-and-space with a line width of 30 nm or less) pattern, forming a pattern satisfying high sensitivity, high resolution property (for example, high resolution and small line edge roughness (LER)) and excellent pattern profile all at the same time, a resist pattern, a crosslinkable negative resist composition, a nanoimprint mold and a photomask.

As a result of intensive studies, the present inventors have found that when a film with a specific thickness formed using a crosslinkable negative resist composition containing a polymer compound having a specific structure is patternwise exposed and then developed by using an alkali developer having a specific alkali component concentration, the above-described object can be attained.

That is, the present invention is as follows.

[1] A resist pattern forming method, comprising: in the following order, (1) a step of forming a film on a substrate by using a negative resist composition capable of undergoing negative conversion by a crosslinking reaction;

(2) a step of exposing the film; and (4) a step of performing development by using an alkali developer after the exposing, wherein the negative resist composition contains (A) a polymer compound having a repeating unit represented by the following formula (I), a thickness of the film formed in the step (1) is from 15 to 40 nm, and an alkali component concentration in the alkali developer is from 0.5 to 1.1 mass %:

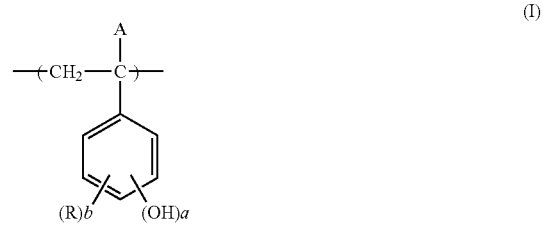

(I)

wherein A represents a hydrogen atom, an alkyl group, a cycloalkyl group, a halogen atom or a cyano group;

R represents a halogen atom, an alkyl group, a cycloalkyl group, an aryl group, an alkenyl group, an aralkyl group, an alkoxy group, an alkylcarbonyloxy group or an alkylsulfonyloxy group, and when a plurality of R's are present, each R may be the same as or different from every other R or a plurality of R's may combine together to form a ring;

a represents an integer of 1 to 3; and b represents an integer of 0 to (3-a).

[2] The resist pattern forming method as described in [1] above, wherein in the development step (4), the development is performed by continuously supplying a substantially fresh alkali developer.

[3] The resist pattern forming method as described in [1] or [2] above, wherein in the repeating unit represented by formula (I), —OH is present on at least one meta-position of a benzene ring with respect to a bond from a main chain of the polymer compound (A).

[4] The resist pattern forming method as described in any one of [1] to [3] above, wherein the alkali developer used in the development step (4) is an aqueous solution containing tetramethylammonium hydroxide.

[5] The resist pattern forming method as described in any one of [1] to [4] above, further comprising:

(3) a baking step between the exposure step (2) and the development step (4).

[6] The resist pattern forming method as described in any one of [1] to [5] above, wherein the exposing in the exposure step (2) is performed by an electron beam or EUV light.

[7] The resist pattern forming method as described in any one of [1] to [6] above, wherein the negative resist composition used in the film forming step (1) further contains (B) a crosslinking agent capable of crosslinking with the polymer compound (A) by an action of an acid, (C) a compound capable of generating an acid upon irradiation with an actinic ray or radiation and (D) a basic compound.

[8] The resist pattern forming method as described in [7] above, wherein the crosslinking agent (B) is a phenolic compound having two or more benzene rings within a molecule.

[9] A resist pattern, which is formed by the resist pattern forming method as described in any one of [1] to [8] above.

[10] A crosslinkable negative resist composition, which is used for the resist pattern forming method as described in any one of [1] to [8] above.

[11] A nanoimprint mold, which is produced by the resist pattern forming method as described in any one of [1] to [8] above.

[12] A photomask, which is produced by the resist pattern forming method as described in any one of [1] to [8] above.

DETAILED DESCRIPTION OF THE INVENTION

The mode for carrying out the present invention is described in detail below.

Specifically, the resist pattern forming method, the resist pattern, the crosslinkable negative resist composition, the nanoimprint mold and the photomask of the present invention are described in detail.

Incidentally, in the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

[Resist Pattern Forming Method and Resist Pattern]

First, the use embodiment of the crosslinkable negative resist composition according to the present invention is described.

The resist pattern forming method of the present invention comprises, in order, (1) a step of forming a film on a substrate by using a negative resist composition capable of undergoing negative conversion by a crosslinking reaction, (2) a step of exposing the film, and (4) a step of performing development by using an alkali developer after exposure, wherein the negative resist composition contains (A) a polymer compound having a repeating unit represented by formula (I) shown later, the thickness of the film formed in the step (1) is from 15 to 40 nm, and the alkali component concentration in the alkali developer is from 0.5 to 1.1 mass %. (In this specification, mass ratio is equal to weight ratio.)

The "negative conversion" as used herein means that the polymer compound is increased in the molecular weight by a crosslinking reaction and becomes insoluble in an alkali developer.

The crosslinkable negative resist composition according to the present invention is preferably a chemical amplification-type crosslinkable negative resist composition.

Also, the resist pattern of the present invention is formed by the resist pattern forming method of the present invention.

Furthermore, as described later, the present invention also relates to a crosslinkable negative resist composition for use in the resist pattern forming method of the present invention.

The pattern forming method of the present invention is described in detail below.

<1> Film Formation

In the present invention, in order to resolve a 1:1 line-and-space pattern with a line width of 30 nm or less, the thickness of the film formed of the crosslinkable negative resist composition must be from 15 to 40 nm. If the film thickness exceeds 40 nm, pattern collapse occurs conspicuously, and a sufficient resolution performance cannot be obtained. Also, if the film thickness is less than 15 nm, good etching resistance cannot be obtained. The film thickness is preferably from 15 to 35 nm. When the film thickness is in this range, excellent etching resistance and resolution performance can be satisfied at the same time.

For obtaining a film of the crosslinkable negative resist composition, the composition is used by dissolving the later-described components in a solvent, filtering the solution through a filter, if desired, and applying it on a support (substrate). The filter is preferably a polytetrafluoroethylene-, polyethylene- or nylon-made filter having a pore size of 0.1 µm or less, more preferably 0.05 µm or less, still more preferably 0.03 µm or less. The coating film is preferably prebaked at 60 to 180° C. for 1 to 20 minutes, more preferably at 80 to 160° C. for 1 to 10 minutes, to form a thin film.

The composition is applied on such a substrate as used in the production of an integrated circuit device (for example, a silicon or silicon dioxide-coated substrate) by an appropriate coating method such as spinner and then dried to form a crosslinkable negative resist composition film.

If desired, various underlying films (inorganic film, organic film) may be coated as an underlayer of the resist composition film.

<2> Exposure

The formed film is irradiated with an actinic ray or radiation through a predetermined mask. Incidentally, in the case of irradiation with an electron beam, lithography not through a mask (direct drawing) is generally performed.

The actinic ray or radiation is not particularly limited but is, for example, KrF excimer laser, ArF excimer laser, EUV light or an electron beam, and EUV light or an electron beam is preferred. That is, the exposure in the step (2) of exposing the film is preferably performed by using an electron beam or EUV light.

<3> Baking

After the exposure, baking (heating) is preferably performed before performing the development. That is, the resist pattern forming method of the present invention preferably further comprises (3) a baking step between the exposure step (2) and the development step (4).

The baking is preferably performed at a heating temperature of 80 to 150° C., more preferably from 90 to 150° C., still more preferably from 100 to 140° C.

The heating time is preferably from 30 to 1,000 seconds, more preferably from 60 to 800 seconds, still more preferably from 60 to 600 seconds.

The heating can be performed by a device attached to a normal exposure/developing machine and may be also performed by using a hot plate or the like.

The reaction in the exposed area is accelerated by the baking, and the sensitivity and pattern profile are improved.

<4> Alkali Development

The alkali component concentration of the alkali developer is from 0.5 to 1.1 mass %. If the alkali component concentration is less than 0.5 mass %, a lot of time is required until the development is completed, and the productivity is seriously reduced. On the other hand, if the alkali component concentration exceeds 1.1 mass %, the resolution performance is impaired due to film loss in the exposed area of the resist film. The alkali component concentration of the alkali developer is preferably from 0.6 to 1.0 mass %. When an alkali developer having an alkali component concentration in this range is used, the productivity and the resolution performance can be satisfied at the same time.

Examples of the alkali component (hereinafter, sometimes referred to as "alkali species") in the alkali developer used include alkalis such as inorganic alkalis (e.g., sodium hydroxide, potassium hydroxide, ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide (TMAH), tetraethylammonium hydroxide, choline) and cyclic amines (e.g., pyrrole, piperidine). An aqueous solution of such alkalis can be used as the alkali developer.

Furthermore, an aqueous alkali solution obtained by adding an appropriate amount of alcohols such as isopropyl alcohol or a surfactant such as nonionic surfactant (for example, Surfynol 440, 465 (produced by Nissin Chemical Industry Co., Ltd.)) to reduce the surface tension may be also used.

The alcohols or surfactant such as nonionic surfactant may be added in an amount necessary to sufficiently reduce the surface tension of the alkali developer.

The relationship between the amount added of alcohols or surfactant and the surface tension of the aqueous solution varies according to the kind of the compound added and therefore, the amount added cannot be indiscriminately specified, but in the case of adding, for example, isopropyl alcohol, the surface tension of the alkali developer can be reduced to a range of 30 to 50 mN/m by adding the alcohol in an amount of 5 to 20 mass % based on the entire mass of the alkali developer.

The surface tension can be measured by a known method, and examples of the method include a measuring method using Model CBVP-Z manufactured by Kyowa Interface Science Co., Ltd. and a platinum plate.

Among these alkali species in the developer, a quaternary ammonium salt is preferred, and tetramethylammonium hydroxide is more preferred (that is, the alkali developer used in the development step (4) is preferably an aqueous solution containing tetramethylammonium hydroxide).

The content of metal ion in the developer is preferably 10 ppb or less, and the content of halogen ion is preferably 10 ppb or less.

As regards the developing method, for example, a method of dipping the substrate in a bath filled with the developer for a fixed time (dip method), a method of raising the developer on the substrate surface by the effect of a surface tension and keeping still for a fixed time, thereby performing development (puddle method), a method of spraying the developer on the substrate surface (spray method), and a method of continuously ejecting the developer on the substrate spinning at a constant speed while scanning the developer ejecting nozzle at a constant rate (dynamic dispense method) may be applied.

After the step of performing development, a step of stopping the development by replacing the solvent with another solvent may be practiced.

Above all, the developing method is preferably a method of performing development by continuously supplying a substantially fresh alkali developer, and specifically, this is a method of continuously spraying a substantially fresh alkali developer on the substrate surface (spray method), or a method of continuously ejecting a substantially fresh alkali developer on the substrate spinning at a constant speed while scanning the developer ejecting nozzle at a constant rate (dynamic dispense method). By continuously supplying a substantially fresh alkali developer to perform development, the development of the exposed area swiftly proceeds and the resolution performance is enhanced. Also, by continuously supplying a fresh alkali developer to perform development, a development defect attributable to scum generated at the stage of switching from development to rinsing can be reduced.

It is important for the development time to satisfy both the time for sufficiently dissolving the components in the resist composition in the unexposed area and the productivity. The development time varies according to the concentration of alkalis contained in the developer and the alkali solubility of components in the resist composition and cannot be indiscriminately specified.

However, an alkali developer adjusted to an alkalis concentration such that the development time becomes 60 to 600 seconds is preferably used. When the development is performed using an alkali developer adjusted to such a concentration as giving the development time in the range above, balance between the uniformity of pattern size in the substrate plane and the productivity is maintained.

The temperature of the developer is preferably from 0 to 50° C., more preferably from 10 to 30° C.

<5> Rinsing

After the step of performing development, a step of stopping the development while replacing the developer with pure water is preferably practiced.

Also, the pure water can be used by adding alcohols such as isopropyl alcohol or a surfactant such as nonionic surfactant each in an appropriate amount.

The rinsing time is preferably a time long enough to fully wash out the alkali developer on the substrate and usually, the rinsing time is preferably from 5 to 600 seconds, more preferably from 10 to 300 seconds.

The temperature of the rinsing solution is preferably from 0 to 50° C., more preferably 10 to 30° C.

The present invention also relates to a nanoimprint mold and a photomask each produced by the resist pattern forming method of the present invention.

These nanoimprint mold and photomask are preferably produced using a resist-coated mask blank prepared by coating a mask blank with a resist film obtained from the crosslinkable negative resist composition of the present invention.

In the case of forming a resist pattern on a resist-coated mask blank according to the resist pattern forming method of the present invention, the substrate used includes a transparent substrate such as quartz and calcium fluoride. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium, tantalum, tungsten, titanium and niobium is stacked. Examples of the material used for the outermost surface layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where a plurality of materials are coated one on another. In the case of a multilayer structure, the film thickness per layer is not particularly limited but is preferably from 5 to 100 mu, more preferably from 10 to 80 nm. The thickness of the entire light-shielding film is not particularly limited but is preferably from 5 to 200 nm, more preferably from 10 to 150 nm.

Subsequently, as described above, the resist film above is exposed and then developed to obtain a resist pattern. Using the obtained resist pattern, etching or the like is appropriately performed, whereby a nanoimprint mold or a photomask is produced.

The photomask of the present invention may be a light-transmitting mask used with ArF excimer laser or the like or may be a light reflection-type mask used for reflection lithography employing EUV light as a light source.

Incidentally, the process when preparing an imprint mold by using the composition of the present invention is described, for example, in Japanese Patent 4,109,085, JP-A-2008-162101 and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basic and Technology Development•Application Expansion of Nanoimprint—Base Technology of Nanoimprint and Latest Technology Expansion), Frontier Shuppan.

[Negative Resist Composition]

The negative resist composition of the present invention, which undergoes negative conversion by a crosslinking reaction and is used for the resist pattern forming method of the present invention, is described below.

The negative resist composition that undergoes negative conversion by a crosslinking reaction contains (A) a polymer compound having a repeating unit represented by formula (I) shown below.

The negative resist composition of the present invention preferably further contains (B) a crosslinking agent capable of crosslinking with the polymer compound (A) by the action of the acid, (C) a compound capable of generating an acid upon irradiation with an actinic ray or radiation and (D) a basic compound.

[1] (A) Polymer Compound

The negative resist composition according to the present invention contains (A) a polymer compound having a repeating unit represented by the following formula (I). Thanks to this configuration, the secondary electron generation efficiency in the electron beam or EUV exposure and the crosslinking efficiency in the exposed area are excellent, and the solubility of the unexposed area for the above-described alkali developer becomes appropriate.

The polymer compound (A) is preferably used together with the later-described (B) compound capable of crosslinking with the polymer compound (A) by the action of an acid.

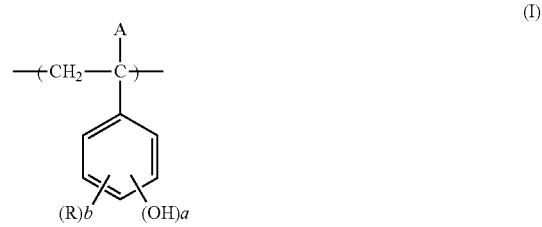

In formula (I), A represents a hydrogen atom, an alkyl group, a cycloalkyl group, a halogen atom or a cyano group.

R represents a halogen atom, an alkyl group, a cycloalkyl group, an aryl group, an alkenyl group, an aralkyl group, an alkoxy group, an alkylcarbonyloxy group or an alkylsulfonyloxy group, and when a plurality of R's are present, each R may be the same as or different from every other R or they may combine together to form a ring.

a represents an integer of 1 to 3. a is preferably 1.

b represents an integer of 0 to (3-a). b is preferably 0 or 1, more preferably 0.

In formula (I), the alkyl group as A may further have a substituent and is preferably an alkyl group having a carbon number of 1 to 3. The cycloalkyl group as A may further have a substituent, may be monocyclic or polycyclic, and is preferably a cycloalkyl group having a carbon number of 5 to 10. Examples of the halogen atom as A include Cl, Br, and F. A is preferably a hydrogen atom or an alkyl group having a carbon number of 1 to 3 (such as methyl group and ethyl group), more preferably a hydrogen atom or a methyl group.

R may be a halogen atom, an alkyl group, a cycloalkyl group, an aryl group, an alkenyl group, an aralkyl group, an alkoxy group, an alkylcarbonyloxy group or an alkylsulfonyloxy group and may further have a substituent. Examples of the halogen atom as R include Cl, Br, F, and I. In the case where a plurality of R's are present, they may combine with each other to form a ring (preferably a 5- or 6-membered ring).

R is preferably a halogen atom, a linear or branched alkyl group having a carbon number of 1 to 8, which may have a substituent, a cycloalkyl group having a carbon number of 5 to 10, which may have a substituent, an aryl group having a carbon number of 6 to 15, which may have a substituent, an alkenyl group having a carbon number of 2 to 8, which may have a substituent, an aralkyl group having a carbon number of 7 to 16, which may have a substituent, an alkoxy group having a carbon number of 1 to 8, which may have a substituent, an alkylcarbonyloxy group having a carbon number of 2 to 8, which may have a substituent, or an alkylsulfonyloxy group having a carbon number of 1 to 8, which may have a substituent.

Each of R is independently more preferably a halogen atom, an alkyl group having a carbon number of 1 to 4, which may have a substituent, an alkoxy group having a carbon number of 1 to 4, which may have a substituent, or an alkylcarbonyloxy group having a carbon number of 2 to 4, which may have a substituent, still more preferably a chlorine atom, a bromine atom, an iodine atom, an alkyl group having a carbon number of 1 to 3 (e.g., methyl group, ethyl group, propyl group, isopropyl group), or an alkoxy group having a carbon number of 1 to 3 (e.g., methoxy group, ethoxy group, propyloxy group, isopropyloxy group).

Examples of the substituent which may be further substituted on A and R include an alkyl group (e.g., methyl group, ethyl group, propyl group, isopropyl group, butyl group, tert-butyl group, hexyl group), an aryl group (e.g., phenyl group, naphthyl group), an aralkyl group, a hydroxyl group, an alkoxy group (e.g., methoxy group, ethoxy group, butoxy group, octyloxy group, dodecyloxy group), an acyl group (e.g., acetyl group, propanoyl group, benzoyl group), and an oxo group, and a substituent having a carbon number of 15 or less is preferred.

The substituent (—(OH)a group and (R)b) on the benzene ring in the repeating unit represented by formula (I) may be positioned at any of a para-position, a meta-position and an ortho-position with respect to the bond from the main chain of the polymer compound (A), but it is preferred that —OH is present at least at one meta-position. On the hydroxybenzene ring, for example, a crosslinking reaction with the later-described crosslinking agent proceeds by using, as a reaction site, the carbon atom adjacent to the bonding position of the hydroxyl group on the benzene ring. Accordingly, when the hydroxyl group is present at a meta-position with respect to the bond to the main chain of the benzene ring, the outermost positioned para-position with respect to the main chain works out to a reaction site and is susceptible to attack from the crosslinking agent. For this reason, it is presumed that the crosslinking efficiency in the exposed area is excellent.

The polymer compound (A) for use in the present invention may also have at least one of the repeating units represented by the following formulae (II) to (IV) together with the repeating unit represented by formula (I):

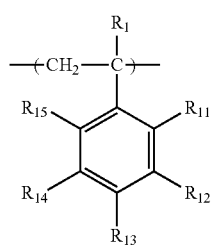

(II)

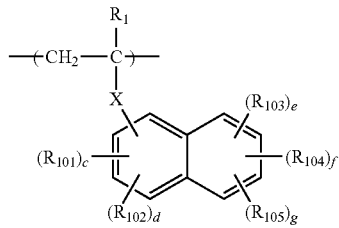

(III)

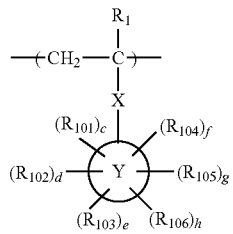

(IV)

In formulae (II) to (IV), $R_1$ represents a hydrogen atom, an alkyl group, a cycloalkyl group, a halogen atom or a cyano group. Specific examples and preferred examples of the alkyl group, cycloalkyl group and halogen atom as $R_1$ are the same as those described for the alkyl group, cycloalkyl group and halogen atom as A in formula (I).

Preferred examples of $R_1$ are the same as preferred examples of A in formula (I).

X represents a single bond, a —COO— group, an —O— group or a —CON($R_{16}$)— group, wherein $R_{16}$ represents a hydrogen atom or an alkyl group (preferably an alkyl group having a carbon number of 1 to 3, such as methyl group, ethyl group or propyl group). X is preferably a single bond, a —COO— group or a —CON($R_{16}$)— group, more preferably a single bond or a —COO— group.

The ring structure represented by Y is a tricyclic or higher polycyclic aromatic hydrocarbon ring structure and is preferably a structure represented by any one of the following structural formulae:

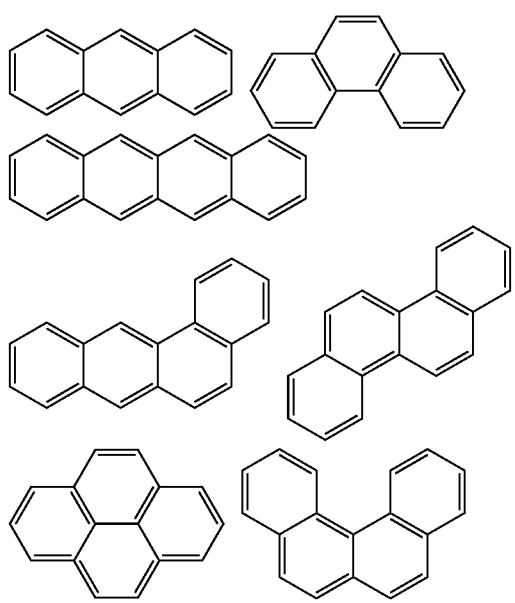

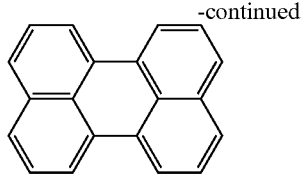

Each of $R_{11}$ to $R_{15}$ independently represents a hydrogen atom, a halogen atom, an alkyl group, a cycloalkyl group, an aryl group, an alkenyl group, an aralkyl group, an alkoxy group, an alkylcarbonyloxy group, an alkylsulfonyloxy group, an arylcarbonyloxy group, an alkoxycarbonyl group, a nitro group or a cyano group. $R_{11}$ to $R_{15}$ may combine with each other to form a ring (preferably a 5- or 6-membered ring). Specific examples of the halogen atom, alkyl group, cycloalkyl group, aryl group, alkenyl group, aralkyl group, alkoxy group, an alkylcarbonyloxy group and alkylsulfonyloxy group represented by $R_{11}$ to $R_{15}$ are the same as those for R in formula (I). The arylcarbonyloxy group represented by $R_{11}$ to $R_{15}$ is preferably an arylcarbonyloxy group having a carbon number of 7 to 16, which may have a substituent. The alkoxycarbonyl group represented by $R_{11}$ to $R_{15}$ is preferably an alkoxycarbonyl group having a carbon number of 2 to 8, which may have a substituent.

Each of $R_{101}$ to $R_{106}$ independently represents a hydroxy group, a halogen atom (e.g., Cl, Br, F, I), a linear or branched alkyl group having a carbon number of 1 to 8, which may have a substituent, a linear or branched alkoxy group having a carbon number of 1 to 8, which may have a substituent, a linear or branched alkylcarbonyloxy group having a carbon number of 2 to 8, which may have a substituent, a linear or branched alkylsulfonyloxy group having a carbon number of 1 to 8, which may have a substituent, an alkenyl group having a carbon number of 2 to 8, which may have a substituent, an aryl group having a carbon number of 6 to 15, which may have a substituent, an aralkyl group having a carbon number of 7 to 16, which may have a substituent, a carboxy group or a perfluoroalkyl group having a carbon number of 1 to 4, which may have a hydroxyl group.

Each of c to h independently represents an integer of 0 to 3.

Specific examples of these substituents are the same as those described as examples of the substituent which may be further substituted on R in formula (I).

Each of $R_{101}$ to $R_{106}$ is independently preferably a halogen atom, an alkyl group having a carbon number of 1 to 4, which may have a substituent, an alkoxy group having a carbon number of 1 to 4, which may have a substituent, or an alkylcarbonyloxy group having a carbon number of 2 to 4, which may have a substituent, more preferably a chlorine atom, a bromine atom, an iodine atom, an alkyl group having a carbon number of 1 to 3 (e.g., methyl group, ethyl group, propyl group, isopropyl group), an alkoxy group having a carbon number of 1 to 3 (e.g., methoxy group, ethoxy group, propyloxy group, isopropyloxy group), or an alkylcarbonyloxy group having a carbon number of 2 or 3 (e.g., acetoxy group, propionyloxy group).

In the case where each of $R_{101}$ to $R_{106}$ combines with a carbon atom of the main chain to form a ring structure, the ring structure formed is preferably a 4- to 6-membered ring.

Each of c to h independently represents preferably 0 or 1, more preferably 0.

The polymer compound (A) for use in the present invention may be any of a polymer compound containing only one kind of a repeating unit represented by formula (I), a polymer compound containing two or more kinds of repeating units represented by formula (I), and a polymer compound containing a repeating unit represented by formula (I) and at least one repeating unit represented by any of formulae (II) to (IV), and another polymerizable monomer capable of controlling the film forming property or solvent solubility may be also copolymerized.

Examples of the polymerizable monomer include, but are not limited to, styrene, an alkyl-substituted styrene, an alkoxystyrene, an acyloxystyrene, a hydrogenated hydroxystyrene, a maleic anhydride, an acrylic acid derivative (e.g., acrylic acid, acrylic acid ester), a methacrylic acid derivative (e.g., methacrylic acid, methacrylic acid ester), an N-substituted maleimide, an acrylonitrile, and a methacrylonitrile.

Other preferred examples of the repeating unit of the polymer compound (A) include a unit having a cyclic structure in the main chain (for example, a unit derived from a monomer having an indene structure), a unit having a naphthol structure, and a repeating unit having —C(CF$_3$)$_2$OH group.

The polymer compound (A) may further contain a repeating unit represented by the following formula (V):

(wherein $R_2$ represents a hydrogen atom or a methyl group, $X_1$ represents a group having a non-acid-decomposable polycyclic alicyclic hydrocarbon structure, Ar represents an aromatic ring, and m is an integer of 1 or more).

In formula (V), $R_2$ represents a hydrogen atom or a methyl group and is preferably a hydrogen atom.

Examples of the aromatic ring of Ar in formula (V) include an aromatic hydrocarbon ring or aromatic heterocyclic ring having a carbon number of 6 to 18, which may have a substituent. Above all, a benzene ring and a naphthalene ring are preferred in view of resolution, and a benzene ring is most preferred.

The aromatic ring of Ar may have a substituent other than the group represented by —OX$_1$, and examples of the substituent include an alkyl group, a halogen atom, a hydroxyl group, an alkoxy group, a carboxyl group and an alkoxycarbonyl group. Among these, an alkyl group, an alkoxy group and an alkoxycarbonyl group are preferred, and an alkoxy group is more preferred.

$X_1$ represents a group having a non-acid-decomposable polycyclic alicyclic hydrocarbon structure. In the present invention, the "non-acid-decomposable" means a property of not causing a decomposition reaction by the action of an acid generated from the later-described (C) compound capable of generating an acid upon irradiation with an actinic ray or radiation.

The polycyclic alicyclic hydrocarbon structure in the group having a non-acid-decomposable polycyclic alicyclic hydrocarbon structure represented by $X_1$ includes an adamantane structure, a decalin structure, a norbornane structure, a cedrol structure, a bicyclohexane structure, a bicycloheptane structure, a bicyclooctane structure, a bicyclodecane structure, a bicyclododecane structure and a tricyclodecane structure, and in view of dry etching resistance, an adamantane structure is most preferred.

m is preferably an integer of 1 to 5 and most preferably 1. When m is 1 and Ar is a benzene ring, the substitution position of —OX₁ may be a para-position, a meta-position or an ortho-position with respect to the bonding position of the benzene ring to the polymer main chain but is preferably a para-position or a meta-position, more preferably a para-position.

The repeating unit represented by formula (V) is preferably a repeating unit represented by the following formula (VI).

When a polymer compound having a repeating unit represented by formula (VI) is used, Tg of the polymer compound becomes high and a very hard resist film is formed, so that the acid diffusion or dry etching resistance can be more unfailingly controlled.

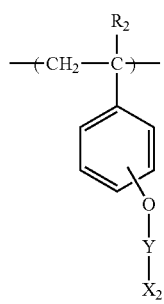

(VI)

(wherein $R_2$ represents a hydrogen atom or a methyl group, Y represents a single bond or a divalent linking group, and $X_2$ represents a non-acid-decomposable polycyclic alicyclic hydrocarbon group).

In formula (VI), $R_2$ represents a hydrogen atom or a methyl group and is preferably a hydrogen atom.

In formula (VI), Y is preferably a divalent linking group. The divalent linking group of Y is preferably a carbonyl group, a thiocarbonyl group, an alkylene group (preferably having a carbon number of 1 to 10, more preferably a carbon number of 1 to 5), a sulfonyl group, —COCH₂—, —NH—, or a divalent linking group composed of a combination thereof (preferably having a total carbon number of 1 to 20, more preferably a total carbon number of 1 to 10), more preferably a carbonyl group, a sulfonyl group, —CONH— or —CSNH—, still more preferably a carbonyl group.

$X_2$ represents a polycyclic alicyclic hydrocarbon group and is non-acid-decomposable. The polycyclic alicyclic hydrocarbon group of $X_2$ is preferably an adamantyl group, a decalin group, a norbornyl group, a cedrol group, a bicyclohexyl group, a bicycloheptyl group, a bicyclooctyl group, a bicyclodecanyl group, a bicyclododecanyl group or a tricyclodecanyl group, and most preferably an adamantyl group in view of dry etching resistance.

The alicyclic hydrocarbon group may further have a substituent, and examples of the substituent include an alkyl group, a halogen atom, a hydroxyl group, an alkoxy group, a carboxyl group, a carbonyl group and an alkoxycarbonyl group.

In formula (VI), the substitution position of —O—Y—$X_2$ may be a para-position, a meta-position or an ortho-position with respect to the bonding position of the benzene ring to the polymer main chain but is preferably a para-position or a meta-position, more preferably a para-position.

In the present invention, the repeating unit represented by formula (V) is most preferably a repeating unit represented by the following formula (VI'):

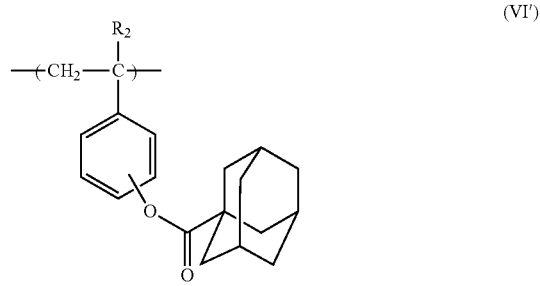

(VI')

(wherein $R_2$ represents a hydrogen atom or a methyl group).

In formula (VI'), $R_2$ represents a hydrogen atom or a methyl group and is preferably a hydrogen atom.

In formula (VI'), the substitution position of the adamantyl ester group may be a para-position, a meta-position or an ortho-position with respect to the bonding position of the benzene ring to the polymer main chain but is preferably a para-position or a meta-position, more preferably a para-position.

The polymer compound (A) may or may not contain the repeating unit represented by formula (V), but in the case of containing the repeating unit represented by formula (V), the content of the repeating unit represented by formula (V) is generally from 1 to 40 mol %, preferably from 2 to 30 mol %, based on all repeating units constituting the polymer compound (A).

In the present invention, as for the polymer compound (A), one kind may be used alone, or two or more kinds may be used in combination.

The polymer compound (A) may be composed of only a repeating unit represented by formula (I) or may contain a repeating unit other than the repeating unit represented by formula (I), and in the case of containing a repeating unit other than the repeating unit represented by formula (I), the content of the repeating unit represented by formula (I) in the polymer compound (A) is generally from 50 to 99.5 mol %, preferably from 70 to 99 mol %, based on all repeating units constituting the polymer compound (A).

Also, in the case where the polymer compound (A) contains a repeating unit other than the repeating unit represented by formula (I), the ratio between the repeating unit represented by formula (I) and the repeating unit represented by formulae (II) to (IV) is, in molar ratio, preferably from 99/1 to 50/50, more preferably from 99/1 to 60/40, still more preferably from 99/1 to 70/30.

The molecular weight of the polymer compound (A) is preferably, in terms of mass average molecular weight, from 1,000 to 50,000, more preferably from 2,000 to 20,000, still more preferably from 2,000 to 6,000.

The polydispersity (Mw/Mn) of the polymer compound (A) is preferably from 1.0 to 2.0, more preferably from 1.0 to 1.35.

Incidentally, the molecular weight and molecular weight distribution of the polymer compound are defined as a value in terms of polystyrene by GPC measurement.

The amount added of the polymer compound (A) (in the case of using a plurality of compounds in combination, the total amount) is from 30 to 95 mass %, preferably from 40 to 90 mass %, more preferably from 50 to 80 mass %, based on the entire solid content of the composition.

The polymer compound (A) can be synthesized by the known radical polymerization or anionic polymerization method. For example, in the radical polymerization method, vinyl monomers are dissolved in an appropriate organic solvent and reacted at room temperature or under heating condition by using a peroxide (e.g., benzoyl peroxide), a nitrile compound (e.g., azobisisobutyronitrile) or a redox compound (e.g., cumene hydroperoxide-ferrous salt) as the initiator, whereby the polymer can be obtained. Also, in the anionic polymerization method, vinyl monomers are dissolved in an appropriate organic solvent and reacted usually under cooling condition by using a metal compound (e.g., butyllithium) as the initiator, whereby the polymer can be obtained.

Specific examples of the polymer compound (A) for use in the present invention are illustrated below, but the present invention is not limited thereto.

In specific examples, n represents a positive integer.

x, y and z represent the molar ratio of the polymer compound composition and in a polymer compound composed of two components, the components are used in ranges of x=10 to 95 and y=5 to 90, preferably x=40 to 90 and y=10 to 60. In a polymer compound composed of three components, the components are used in ranges of x=10 to 90, y=5 to 85 and z=5 to 85, preferably x=40 to 80, y=10 to 50 and z=10 to 50. One of these may be used alone, or two or more thereof may be mixed and used.

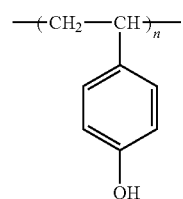
(1)

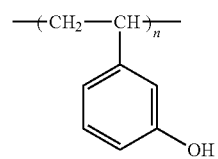
(2)

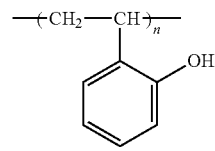
(3)

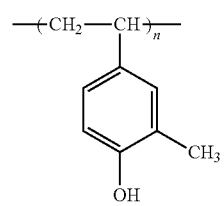
(4)

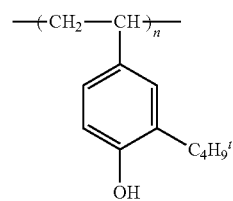
(5)

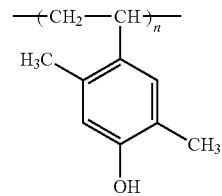
(6)

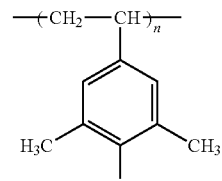
(7)

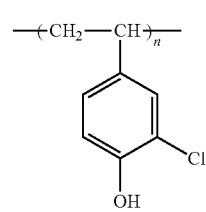
(8)

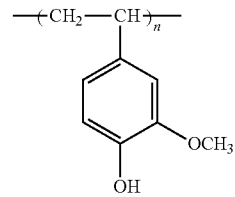
(9)

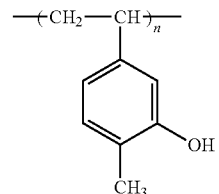
(10)

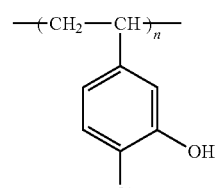
(11)

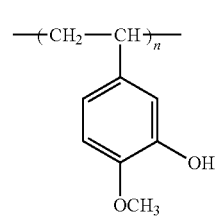
(12)

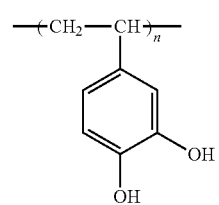
(13)

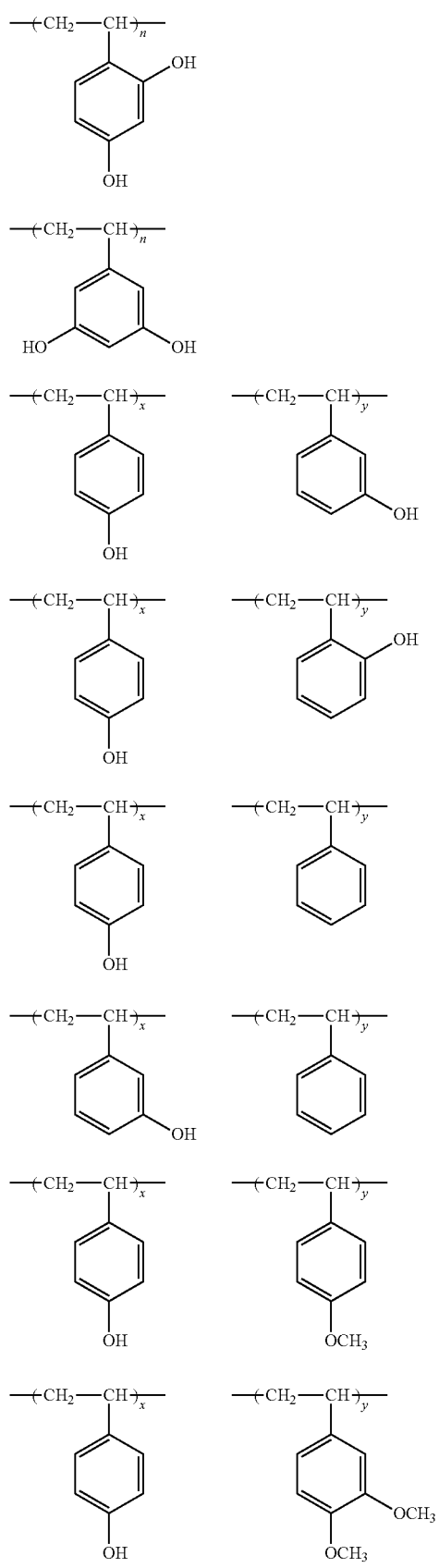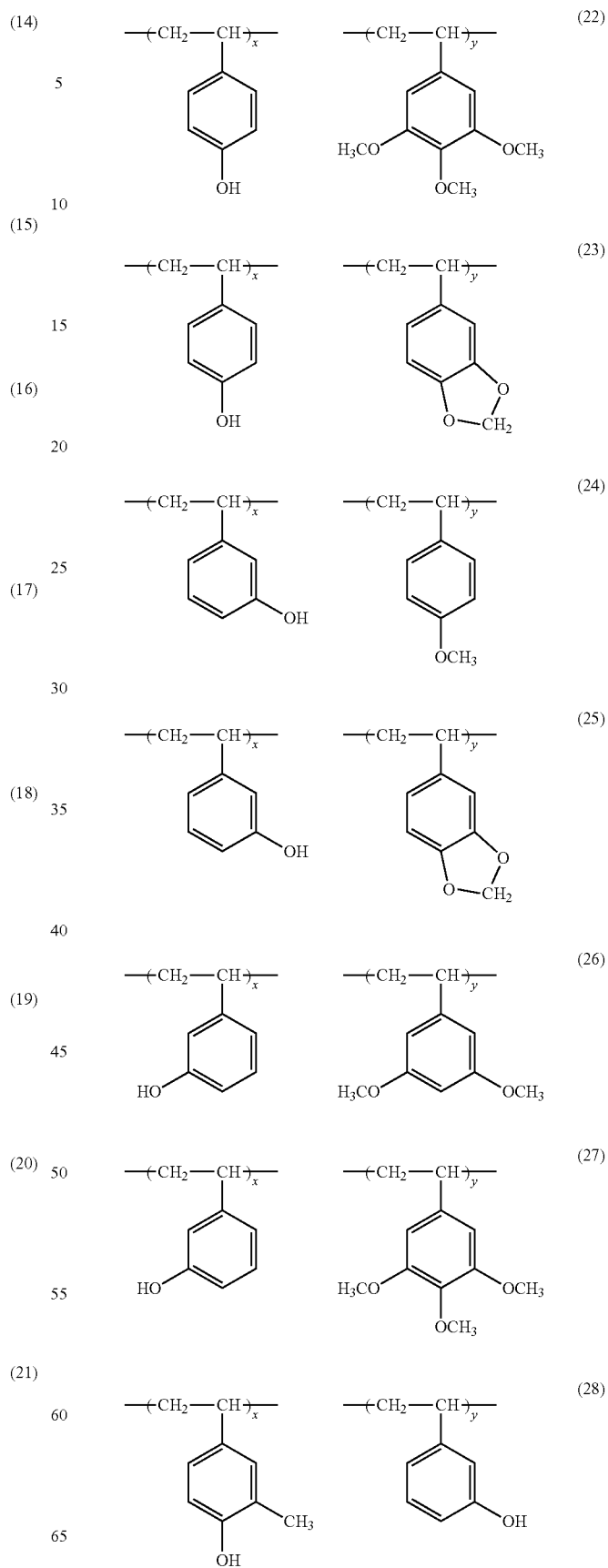

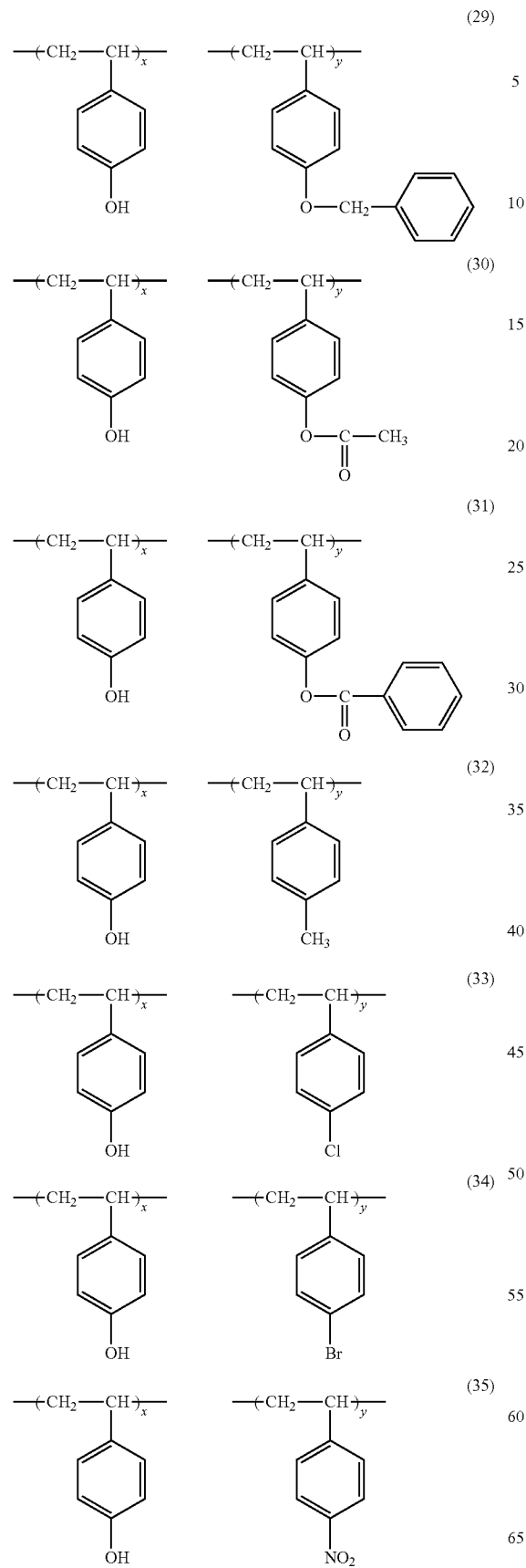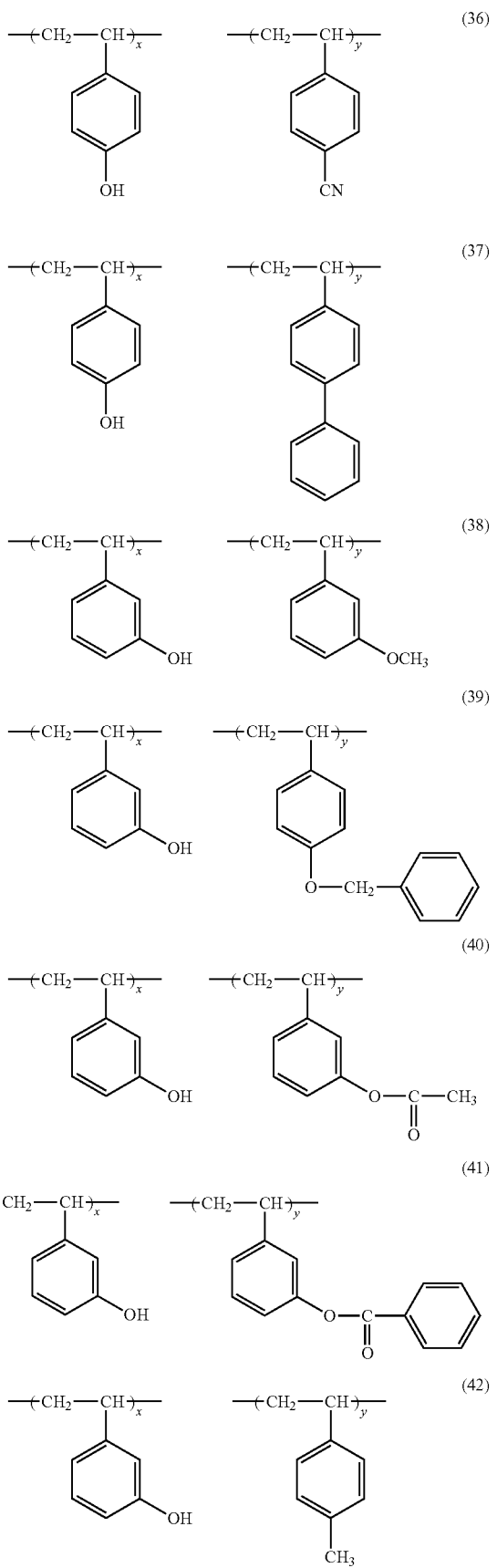

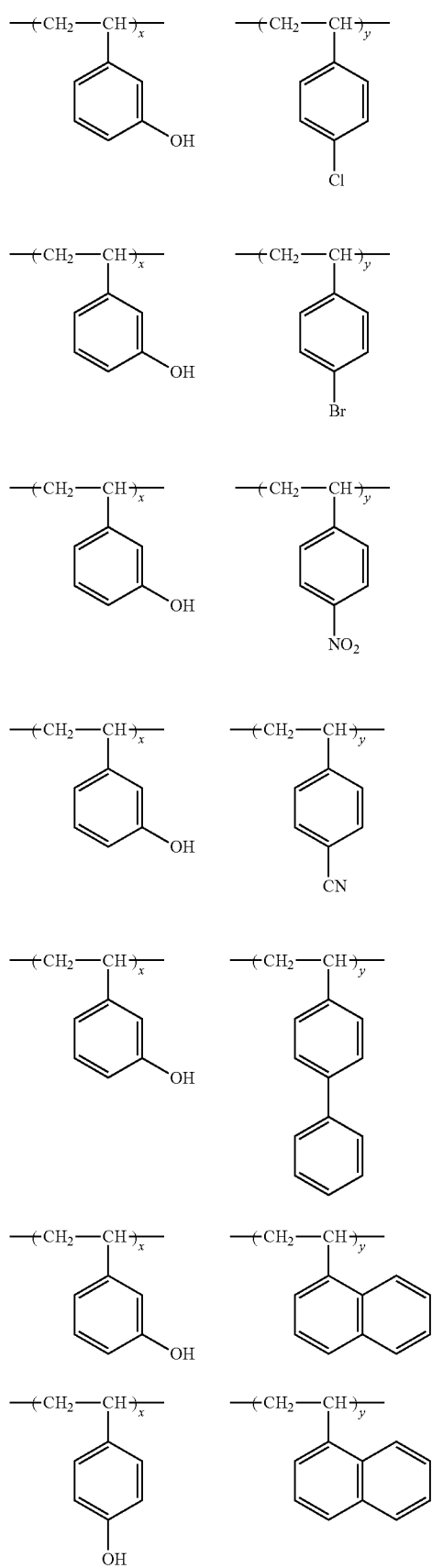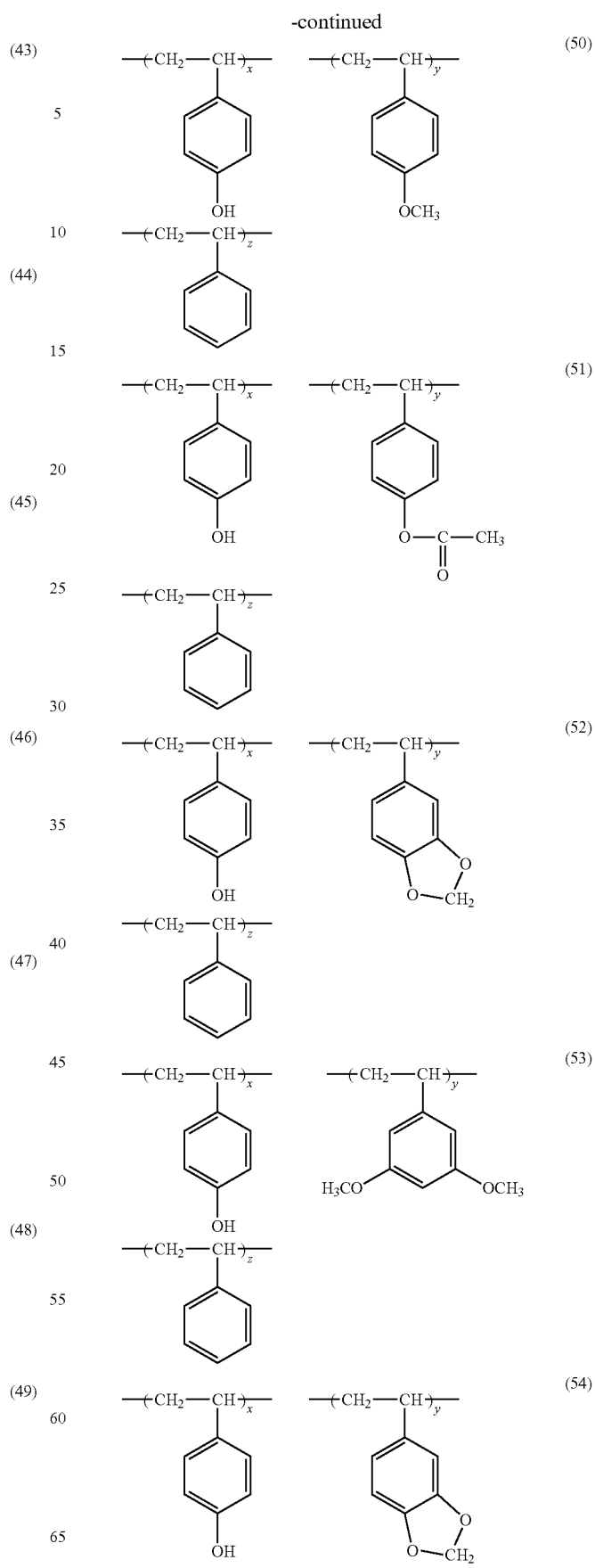

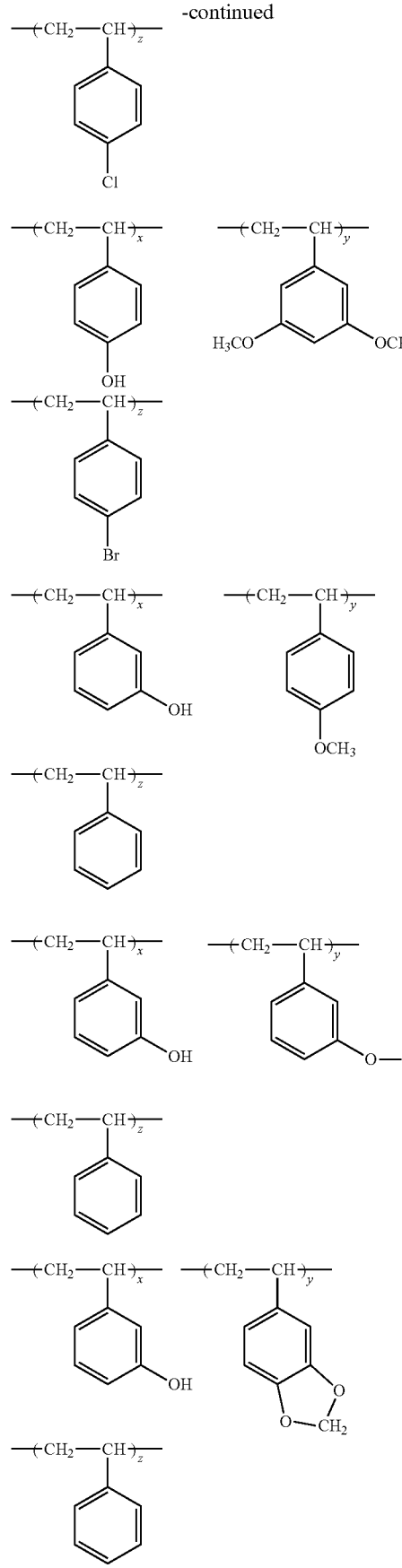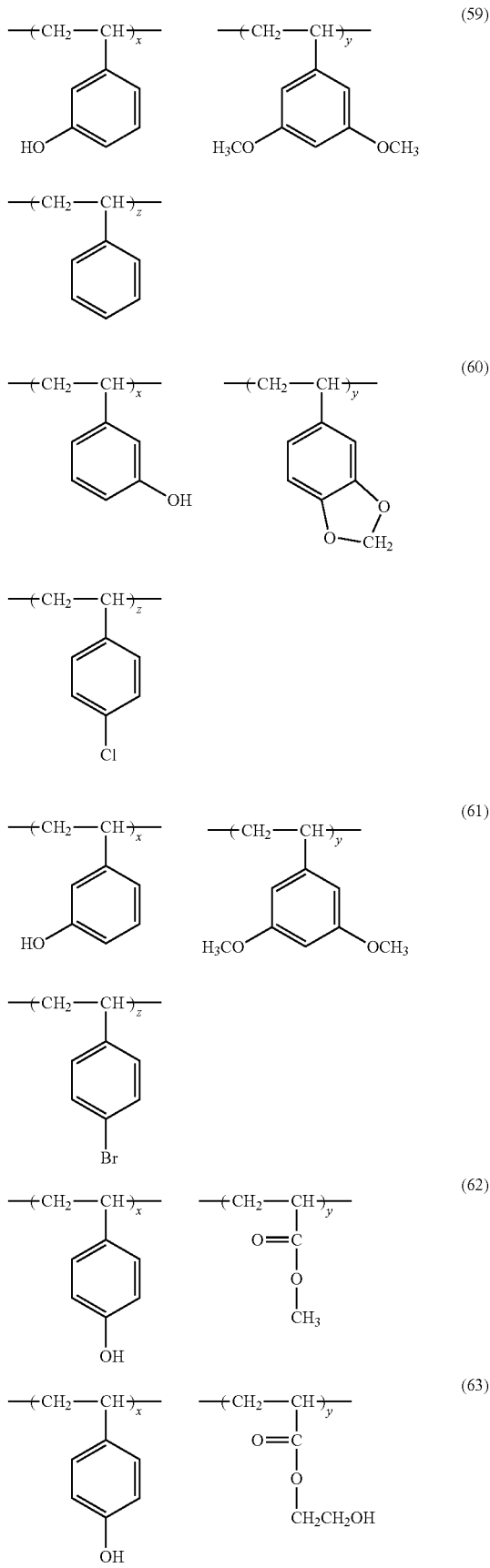

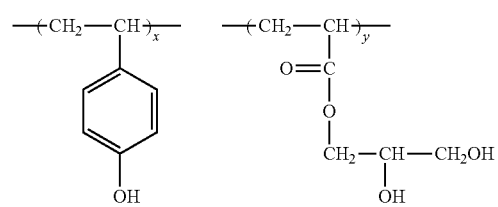
(64)
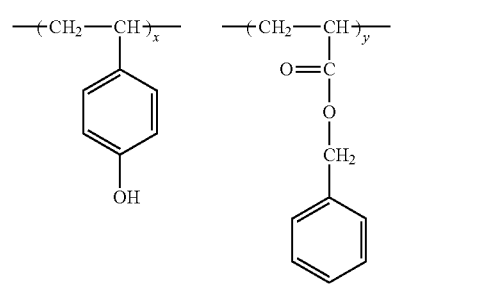
(65)
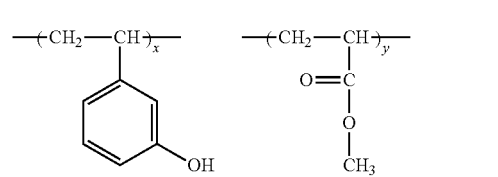
(66)
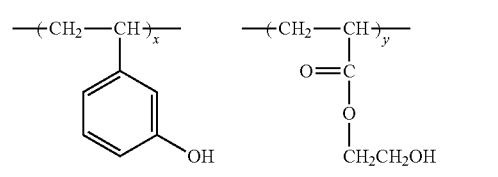
(67)
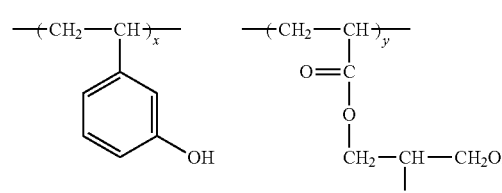
(68)
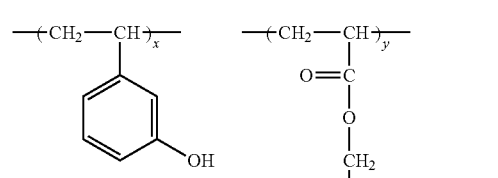
(69)
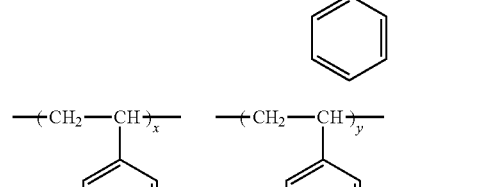
(70)
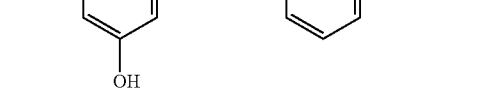
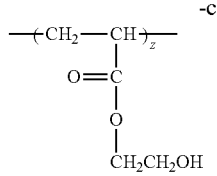
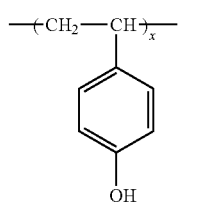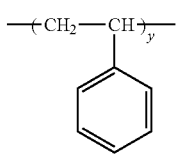
(71)
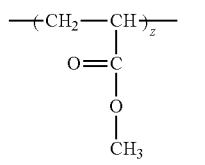
(72)
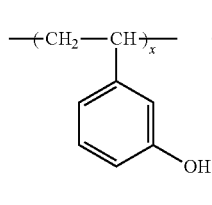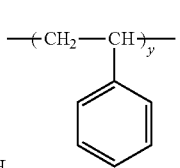
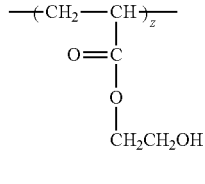
(73)
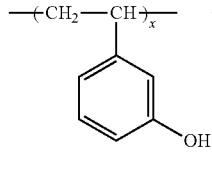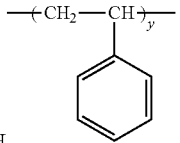
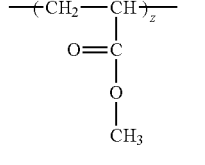
(74)
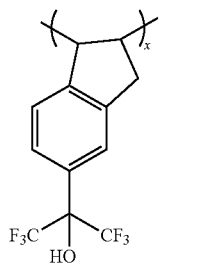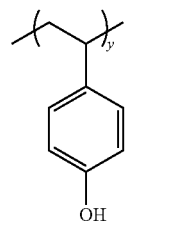

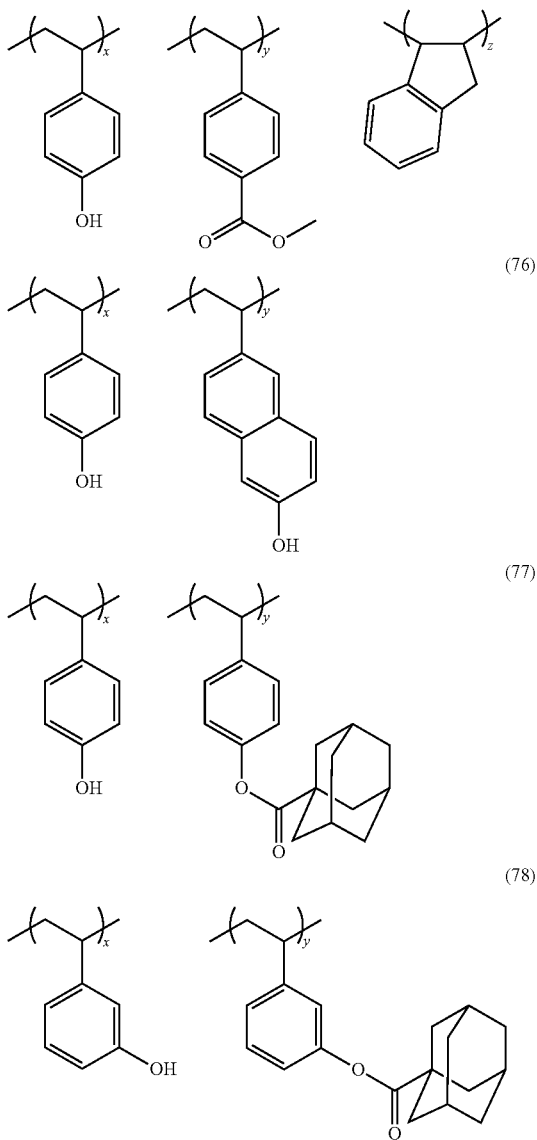

[2] (B) Crosslinking Agent Capable of Crosslinking with Polymer Compound (A) by the Action of Acid In the present invention, a compound capable of crosslinking with the polymer compound (A) by the action of an acid (hereinafter, referred to as the crosslinking agent (B)) is preferably used together with the polymer compound (A). Here, known crosslinking agents can be effectively used.

The crosslinking agent (B) is, for example, a compound having a crosslinkable group capable of crosslinking the polymer compound (A) and is preferably a compound having, as the crosslinkable group, two or more hydroxymethyl groups, alkoxymethyl groups, acyloxymethyl groups or alkoxymethyl ether groups, or an epoxy compound.

More preferred examples of the crosslinking agent include an alkoxymethylated or acyloxymethylated melamine compound or resin, an alkoxymethylated or acyloxymethylated urea compound or resin, a hydroxymethylated or alkoxymethylated phenolic compound or resin, and an alkoxymethyl etherified phenolic compound or resin. Among these, a hydroxymethylated or alkoxymethylated phenolic compound or resin is most preferred in view of sensitivity, resolution performance and pattern profile.

Particularly preferred crosslinking agents (B) include a phenol derivative having a molecular weight of 1,200 or less, containing from three to five benzene rings in the molecule and further having two or more hydroxymethyl groups or alkoxymethyl groups in total, where the hydroxymethyl groups or alkoxymethyl groups are bonded in a concentrated manner to at least any one benzene ring or distributed among the benzene rings. By using such a phenol derivative, the effects of the present invention can be more remarkably brought out. The alkoxymethyl group bonded to the benzene ring is preferably an alkoxymethyl group having a carbon number of 6 or less. Specifically, a methoxymethyl group, an ethoxymethyl group, an n-propoxymethyl group, an i-propoxymethyl group, an n-butoxymethyl group, an i-butoxymethyl group, a sec-butoxymethyl group or a tert-butoxymethyl group is preferred. An alkoxy-substituted alkoxy group such as 2-methoxyethoxy group and 2-methoxy-1-propoxy group is also preferred.

The crosslinking agent (B) is preferably a phenolic compound having a benzene ring in the molecule, more preferably a phenolic compound having two or more benzene rings in the molecule, and is preferably a phenolic compound not containing a nitrogen atom. When two or more benzene rings are present in the crosslinking agent (B), the secondary electron generation efficiency becomes high and the crosslinking reaction sufficiently proceeds, as a result, the sensitivity and resolution performance are increased.

The crosslinking agent (B) is preferably a phenolic compound having, per molecule, from 2 to 8 crosslinkable groups capable of crosslinking the polymer compound (A), more preferably from 3 to 6 crosslinkable groups. When the number of crosslinkable groups in the crosslinking agent (B) is in the range above, thanks to superior crosslinking efficiency in the exposed area, the alkali developer can hardly permeate the resist pattern and in turn, high resolution and small LER are obtained, revealing excellent resolution performance.

Out of these phenol derivatives, particularly preferred compounds are illustrated below. In the formulae, each of $L^1$ to $L^8$, which may be the same or different, represents a crosslinkable group such as alkoxymethyl group. The crosslinkable group is preferably a hydroxymethyl group, a methoxymethyl group or an ethoxymethyl group.

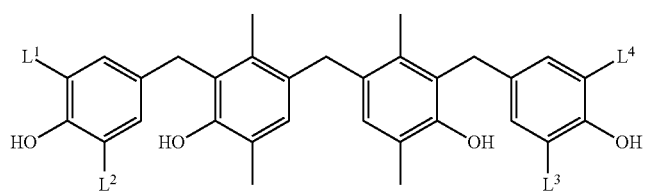

29
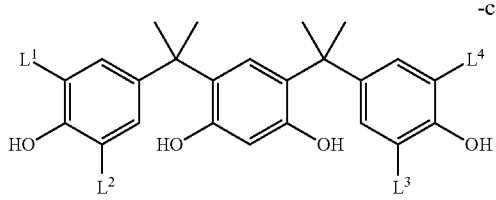
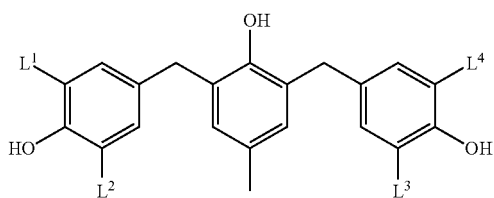
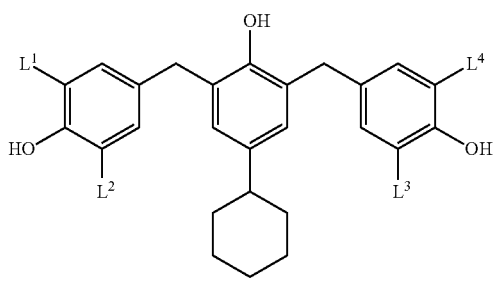
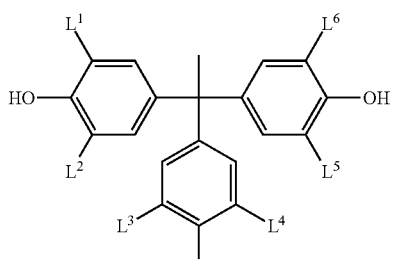
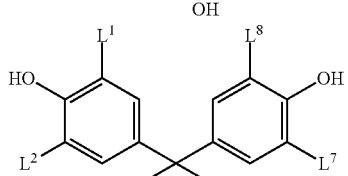
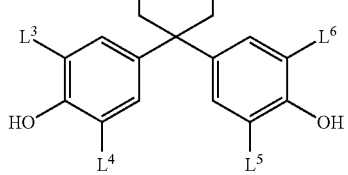
30
-continued
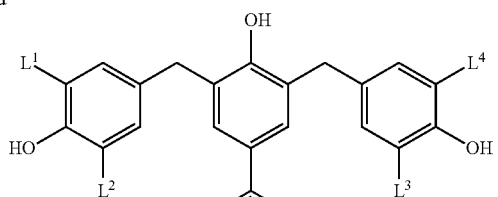
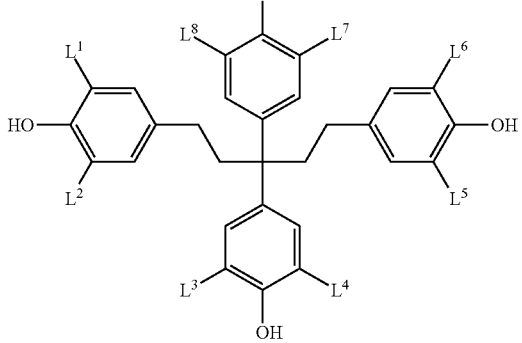
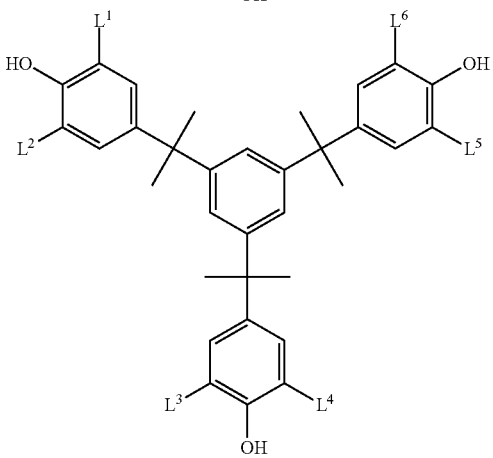
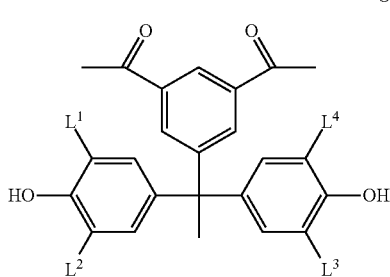
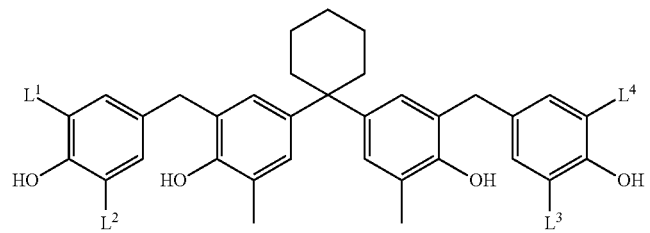

-continued
31
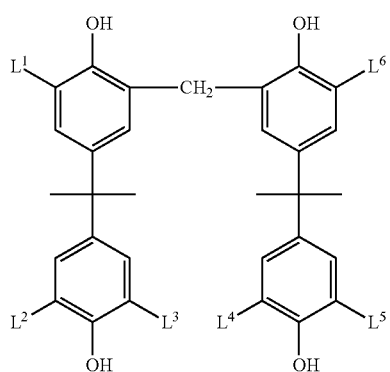
32
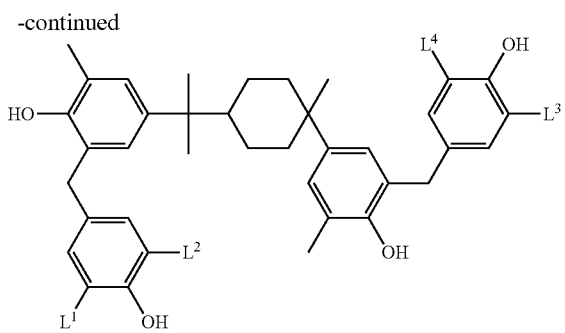
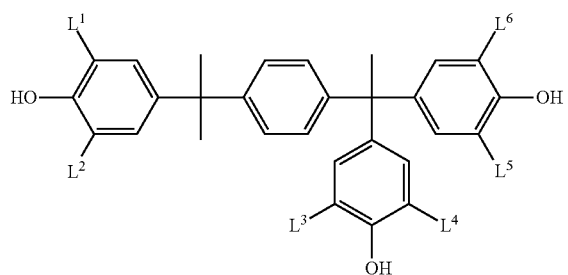
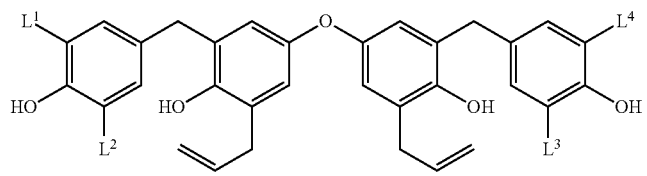
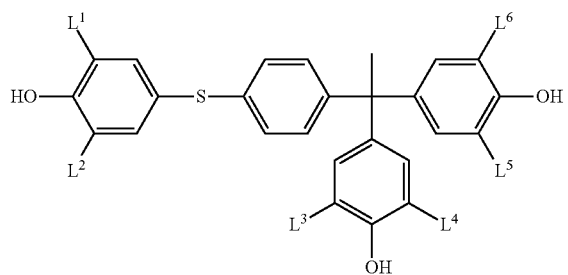
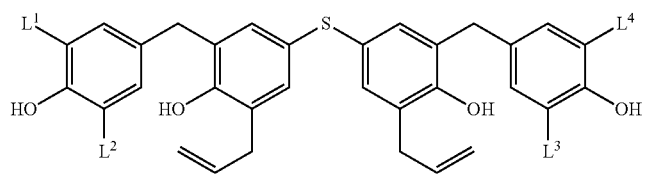
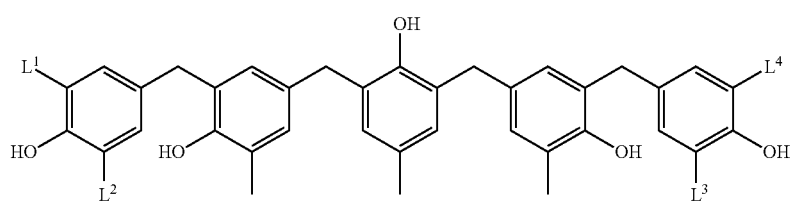

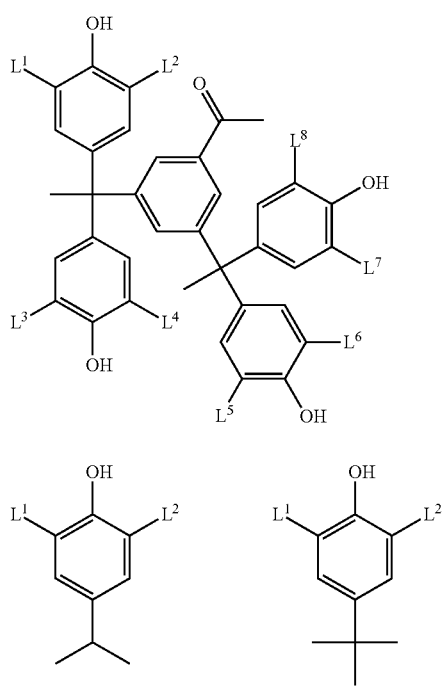

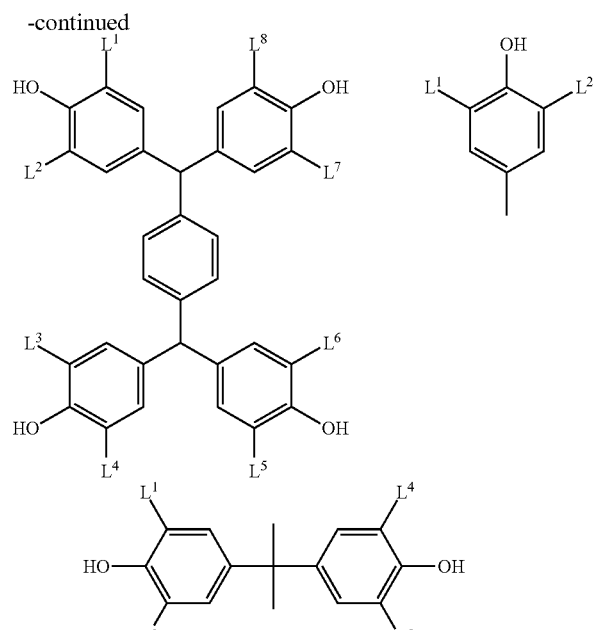

As for the crosslinking agent (B), a commercially available product may be used, or the compound may be synthesized by a known method. For example, a phenol derivative having a hydroxymethyl group can be obtained by reacting a phenolic compound having no corresponding hydroxymethyl group (a compound where in the formulae above, each of $L^1$ to $L^8$ is a hydrogen atom) with formaldehyde in the presence of a base catalyst. At this time, in order to prevent resinification or gelling, the reaction is preferably performed at a temperature of 60° C. or less. Specifically, the compound can be synthesized by the method described, for example, in JP-A-6-282067 and JP-A-7-64285.

A phenol derivative having an alkoxymethyl group can be obtained by reacting a phenol derivative having a corresponding hydroxymethyl group with an alcohol in the presence of an acid catalyst. At this time, in order to prevent resinification or gelling, the reaction is preferably performed at a temperature of 100° C. or less. Specifically, the compound can be synthesized by the method described, for example, in EP632003A1. The thus-synthesized phenol derivative having a hydroxymethyl group or an alkoxymethyl group is preferred in view of stability during storage, and a phenol derivative having an alkoxymethyl group is more preferred in view of stability during storage. As for the phenol derivative having two or more hydroxymethyl groups or alkoxymethyl groups in total which are bonded in a concentrated manner to any one benzene ring or distributed among the benzene rings, one kind of a compound may be used alone, or two or more kinds of compounds may be used in combination.

From the standpoint of preventing reduction in the residual film ratio and resolution and at the same time, keeping good the stability during storage of the resist solution, the crosslinking agent is added in an amount of preferably from 3 to 40 mass %, more preferably from 5 to 30 mass %, still more preferably form 8 to 25 mass %, based on the entire solid content of the resist composition.

In the present invention, one kind of a crosslinking agent may be used alone, or two or more kinds of crosslinking agents may be used in combination.

[3] (C) Compound Capable of Generating Acid Upon Irradiation with Actinic Ray or Radiation The negative resist composition of the present invention preferably contains (C) a compound capable of generating an acid upon irradiation with an actinic ray or radiation (hereinafter, sometimes referred to as "acid generator (C)"), more preferably a compound capable of generating an acid except for a carboxylic acid upon irradiation with an actinic ray or radiation. The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Out of the compounds capable of decomposing upon irradiation with an actinic ray or radiation to generate an acid, which are used as the acid generator (C), preferred are the compounds represented by the following formulae (ZI), (ZII) and (ZIII):

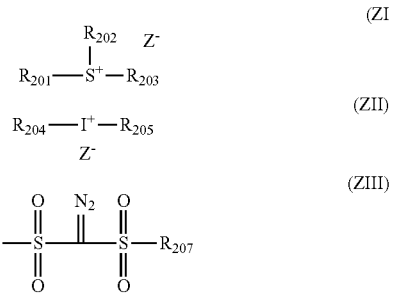

In formula (ZI), each of $R_{201}$, $R_{202}$ and $R_{203}$ independently represents an organic group.

$Z^-$ represents a non-nucleophilic anion, and preferred examples thereof include sulfonate anion, bis(alkylsulfonyl)

amide anion, tris(alkylsulfonyl)methide anion, $BF_4^-$, $PF_6^-$ and $SbF_6^-$. The anion is preferably an organic anion containing a carbon atom. Preferred organic anions include organic anions represented by the following formulae AN1 to AN3:

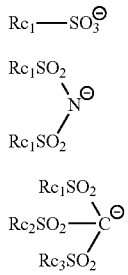

In formulae AN1 to AN3, each of $Rc_1$ to $Rc_3$ independently represents an organic group.

The organic group in $Rc_1$ to $Rc_3$ includes an organic group having a carbon number of 1 to 30 and is preferably an alkyl group which may be substituted, an aryl group which may be substituted, or a group formed by connecting a plurality of these groups through a single bond or a linking group such as —O—, —$CO_2$—, —S—, —$SO_3$— and —$SO_2N(Rd_1)$—. Such a group may further form a ring structure together with another alkyl or aryl group bonded.

$Rd_1$ represents a hydrogen atom or an alkyl group and may form a ring structure together with the alkyl or aryl group bonded.

The organic group of $Rc_1$ to $Rc_3$ may be an alkyl group substituted with a fluorine atom or fluoroalkyl group at the 1-position, or a phenyl group substituted with a fluorine atom or a fluoroalkyl group. By virtue of having a fluorine atom or a fluoroalkyl group, the acidity of the acid generated upon irradiation with light increases and the sensitivity is enhanced. When each of $Rc_1$ to $Rc_3$ has 5 or more carbon atoms, at least one carbon atom is preferably substituted with a hydrogen atom, and it is more preferred that the number of hydrogen atoms is larger than the number of fluorine atoms. The absence of a perfluoroalkyl group having a carbon number of 5 or more enables reduction in the toxicity to ecology.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

The group formed by combining two members out of $R_{201}$ to $R_{203}$ includes an alkylene group (e.g., butylene group, pentylene group).

Specific examples of the organic group as $R_{201}$, $R_{202}$ and $R_{203}$ include the corresponding groups in the compounds (ZI-1), (ZI-2) and (ZI-3) which are described later.

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI).

More preferred components (ZI) include the compounds (ZI-1), (ZI-2) and (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group as $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a cycloalkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$ may be linear or branched but is preferably a linear or branched alkyl group having a carbon number of 1 to 10 (e.g., methyl group, ethyl group, propyl group, butyl group, pentyl group). The cycloalkyl group as $R_{201}$ to $R_{203}$ includes a cycloalkyl group having a carbon number of 3 to 10 (e.g., cyclopentyl group, cyclohexyl group, norbornyl group).

The 2-oxoalkyl group as $R_{201}$ to $R_{203}$ may be linear, branched or cyclic and is preferably a group having >C=O at the 2-position of the above-described alkyl or cycloalkyl group.

The alkoxy group in the alkoxycarbonylmethyl group as $R_{201}$ to $R_{203}$ includes an alkoxy group preferably having a carbon number of 1 to 5 (e.g., methoxy group, ethoxy group, propoxy group, butoxy group, pentoxy group).

Each of $R_{201}$ to $R_{203}$ may be further substituted with a halogen atom, an alkoxy group (for example, having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene group, pentylene group).

The compound (ZI-3) is described below.

The compound (ZI-3) is a compound represented by the following formula (ZI-3), and this is a compound having a phenacylsulfonium salt structure.

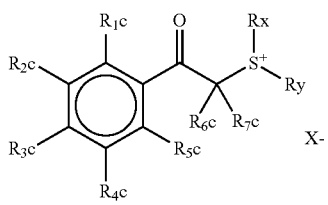

(ZI-3)

Each of $R_{1c}$ to $R_{5c}$ independently represents a hydrogen atom, an alkyl group, an alkoxy group or a halogen atom.

Each of $R_{6c}$ and $R_{7c}$ independently represents a hydrogen atom or an alkyl group.

Each of $R_x$ and $R_y$ independently represents an alkyl group, a 2-oxoalkyl group, an alkoxycarbonylmethyl group, an allyl group or a vinyl group.

Any two or more members out of $R_{1c}$ to $R_{7c}$ may combine to form a ring structure. Also, $R_x$ and $R_y$ may combine to form a ring structure. These ring structures may contain an oxygen atom, a sulfur atom, an ester bond or an amide bond.

$X^-$ has the same meaning as $Z^-$ in formula (ZI).

Specific examples of the compound (ZI-3) include the compounds illustrated in paragraphs 0046 and 0047 of JP-A-2004-233661 and paragraphs 0040 to 0046 of JP-A-2003-35948.

Formulae (ZII) and (ZIII) are described below.

In formulae (ZII) and (ZIII), each of $R_{204}$ to $R_{207}$ independently represents an aryl group which may have a substituent, an alkyl group which may have a substituent, or a cycloalkyl group which may have a substituent.

Specific examples and preferred examples of the aryl group of $R_{204}$ to $R_{207}$ are the same as those described for the aryl group as $R_{201}$ to $R_{203}$ in compound (ZI-1).

Specific examples and preferred examples of the alkyl group and cycloalkyl group of $R_{204}$ to $R_{207}$ are the same as those described for the linear or branched alkyl group and cycloalkyl group as $R_{201}$ to $R_{203}$ in compound (ZI-2).

$Z^-$ has the same meaning as $Z^-$ in formula (ZI).

Out of the compounds capable of generating an acid upon irradiation with an actinic ray or radiation, which are used as the acid generator (C), other preferred compounds include the compounds represented by the following formulae (ZIV), (ZV) and (ZVI):

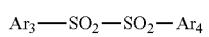

ZIV

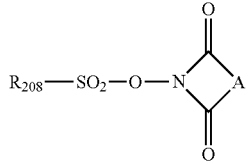

ZV

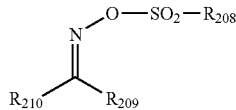

ZVI

In formulae (ZIV) to (ZVI), each of $Ar_3$ and $Ar_4$ independently represents a substituted or unsubstituted aryl group.

Each $R_{208}$ in formulae (ZV) and (ZVI) independently represents a substituted or unsubstituted alkyl group, a substituted or unsubstituted cycloalkyl group, or a substituted or unsubstituted aryl group. From the standpoint of increasing the strength of the generated acid, $R_{208}$ is preferably substituted with a fluorine atom.

Each of $R_{209}$ and $R_{210}$ independently represents a substituted or unsubstituted alkyl group, a substituted or unsubstituted cycloalkyl group, a substituted or unsubstituted aryl group, or an electron-withdrawing group. $R_{209}$ is preferably a substituted or unsubstituted aryl group. $R_{210}$ is preferably an electron-withdrawing group, more preferably a cyano group or a fluoroalkyl group.

A represents a substituted or unsubstituted alkylene group, a substituted or unsubstituted alkenylene group, or a substituted or unsubstituted arylene group.

In the present invention, a compound having a plurality of structures represented by formula (ZVI) is also preferred. For example, the compound may be a compound having a structure where either one of $R_{209}$ and $R_{210}$ in a compound represented by formula (ZVI) is bonded to either one of $R_{209}$ and $R_{210}$ in another compound represented by formula (ZVI).

Among the compounds capable of decomposing upon irradiation with an actinic ray or radiation to generate an acid except for a carboxylic acid, which are used as the acid generator (C), the compounds represented by formulae (ZI) to (ZIII) are preferred, the compound represented by formula (ZI) is more preferred, and the compounds represented by (ZI-1) to (ZI-3) are most preferred.

Specific examples of the acid generator (C) are illustrated below, but the present invention is not limited thereto.

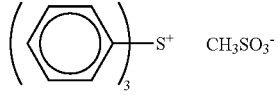

(C1)

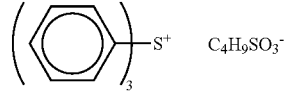

(C2)

-continued
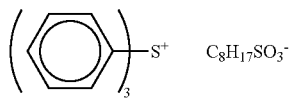 (C3)
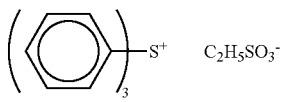 (C4)
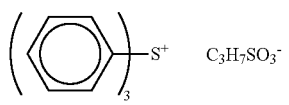 (C5)
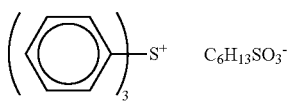 (C6)
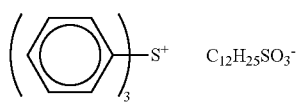 (C7)
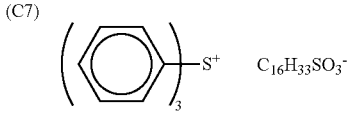 (C8)
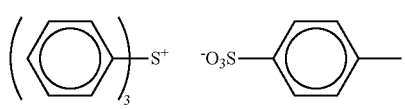 (C9)
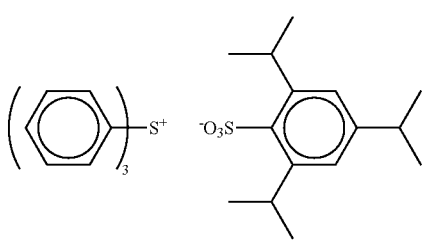 (C10)
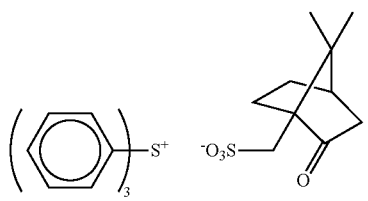 (C11)
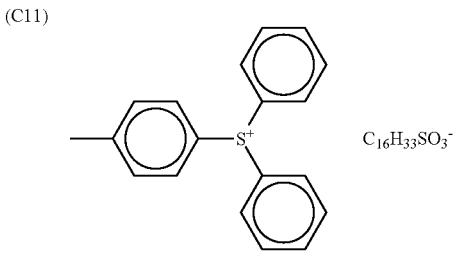 (C12)
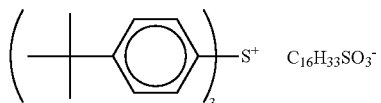 (C13)
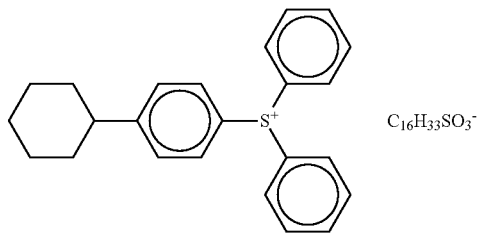 (C14)
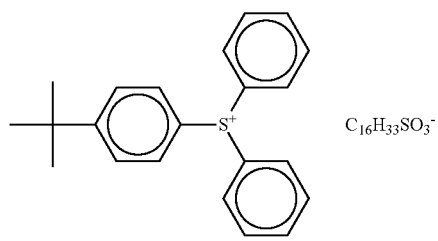 (C15)
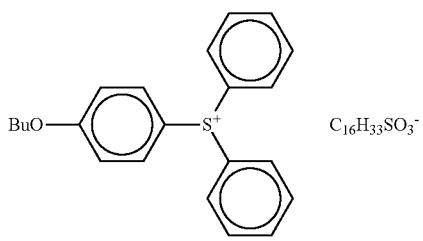 (C16)
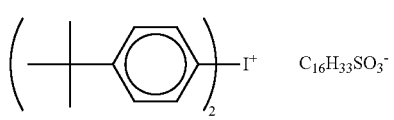 (C17)
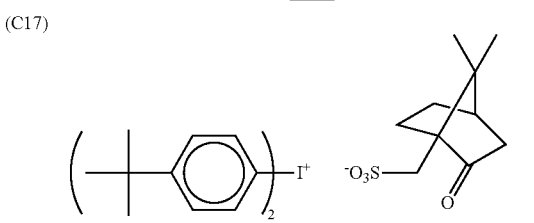 (C18)

-continued
(C19) 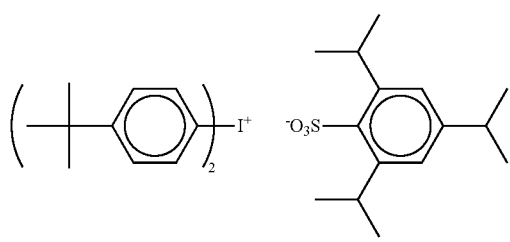
(C20) 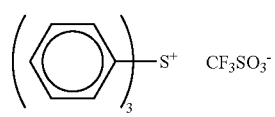
(C21) 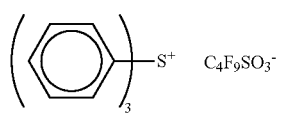
(C22) 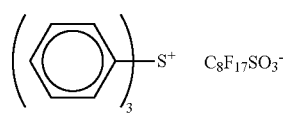
(C23) 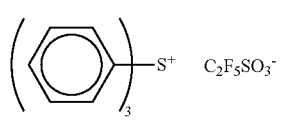
(C24) 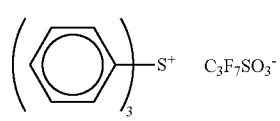
(C25) 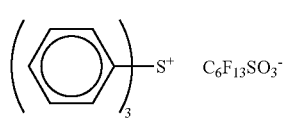
(C26) 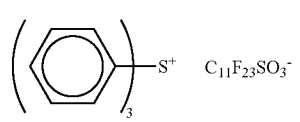
(C27) 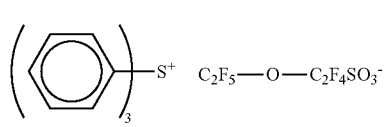
(C28) 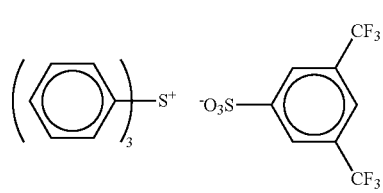
(C29) 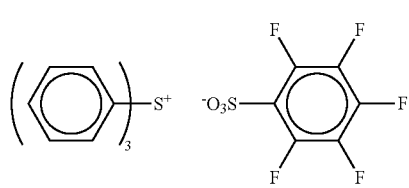
(C30) 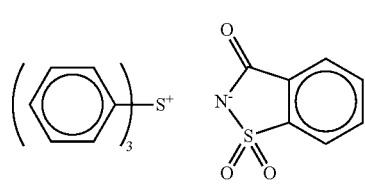
(C31) 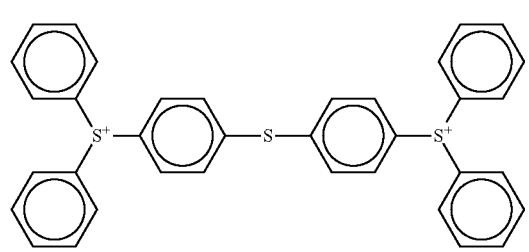 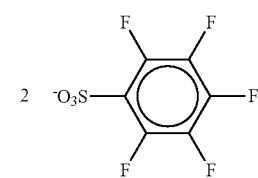
(C32) 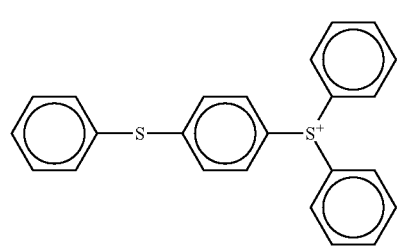 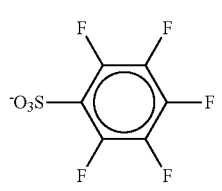

-continued
(C33) 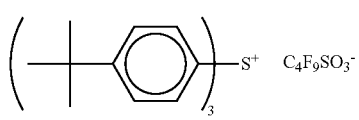
(C34) 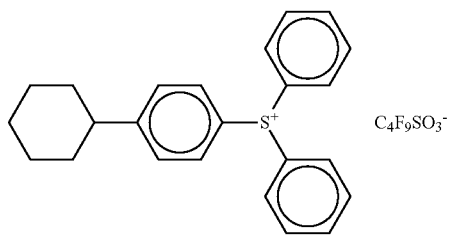
(C35) 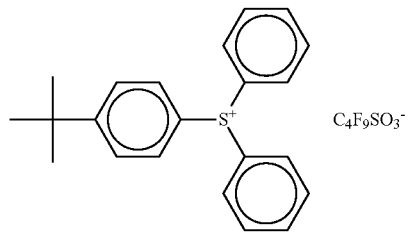
(C36) 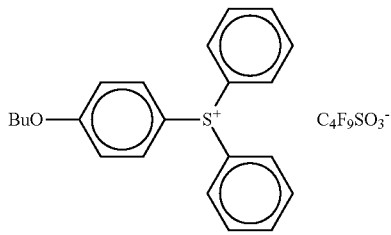
(C37) 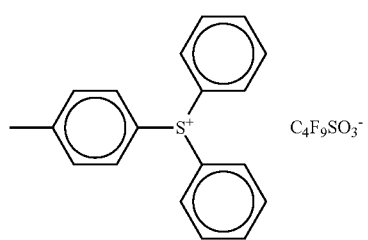
(C38) 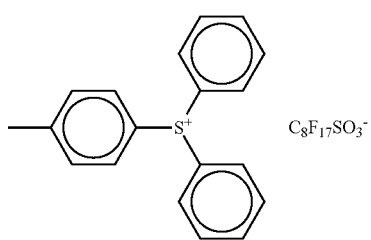
(C39) 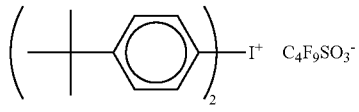
(C40) 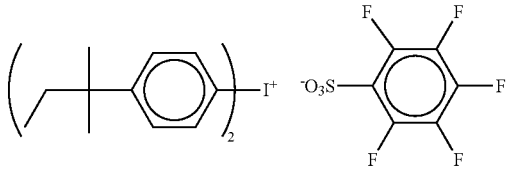
(C41) 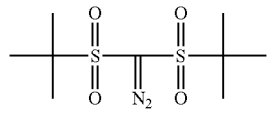
(C42) 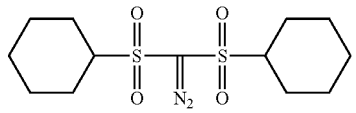
(C43) 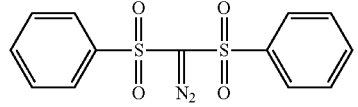
(C44) 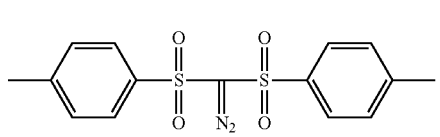
(C45) 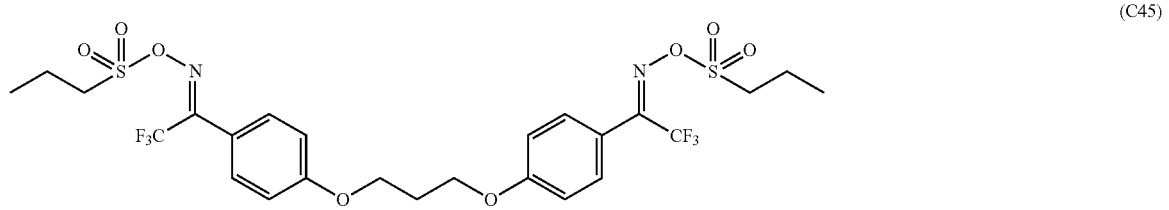
(C46) 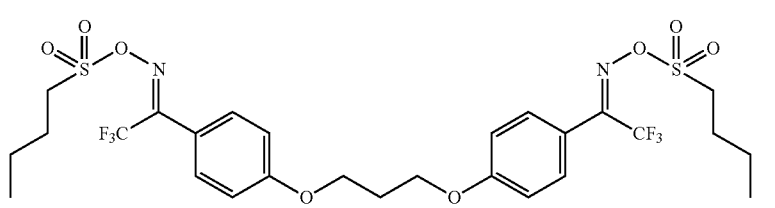

-continued
(C47)
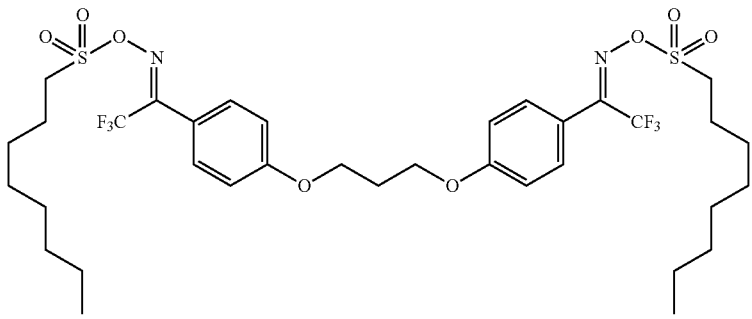
(C48)
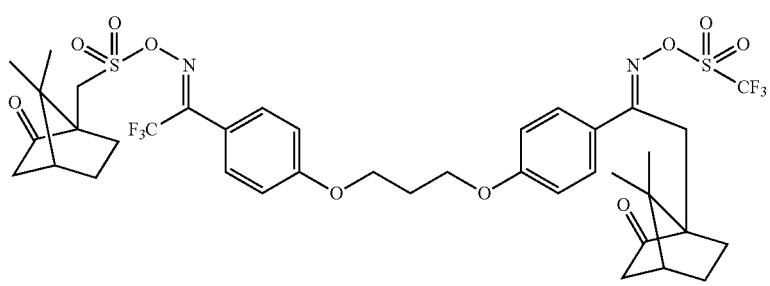
(C49)
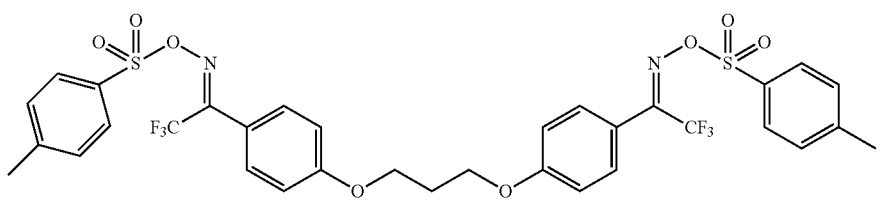
(C50)
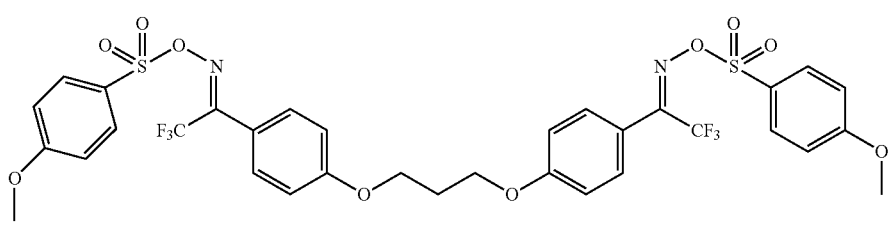
(C51)
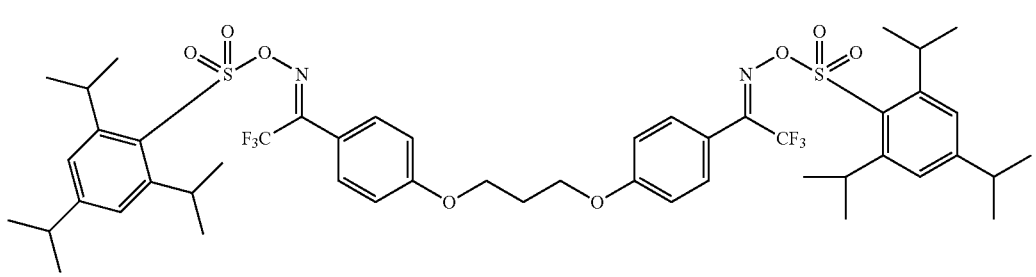
(C52) (C53)
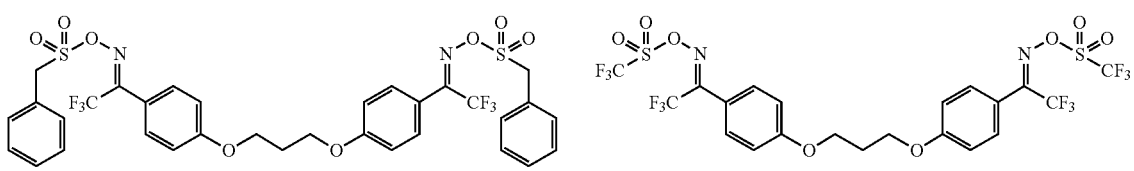

(C54)
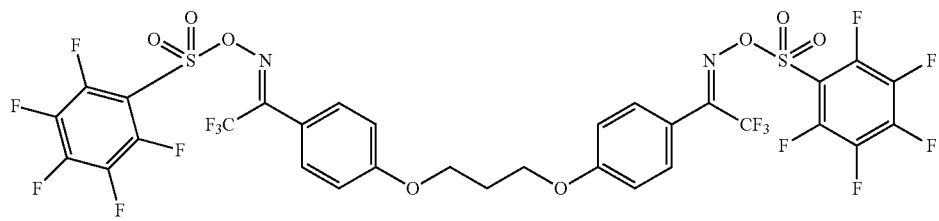
(C55)
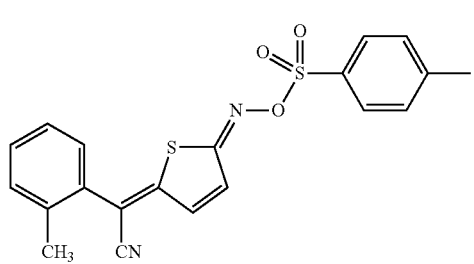
(C56)
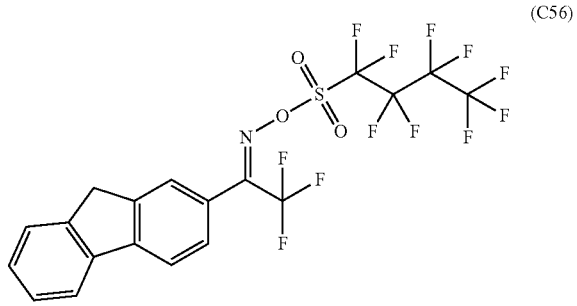
(C57)
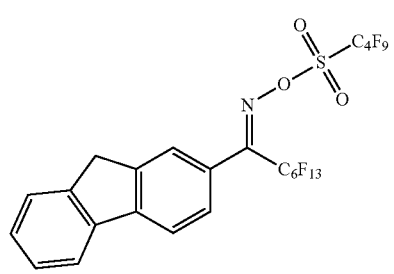
(C58)
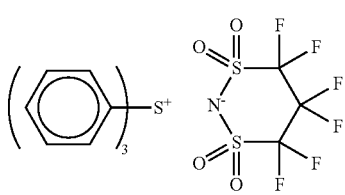
(C59)
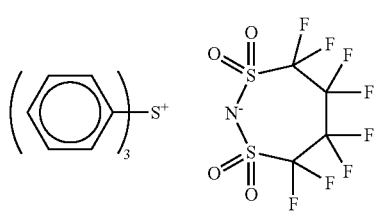
(C60)
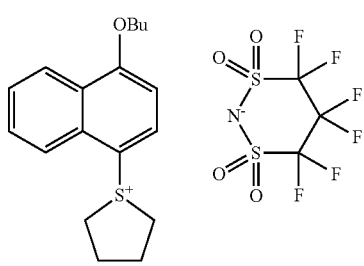
(C61)
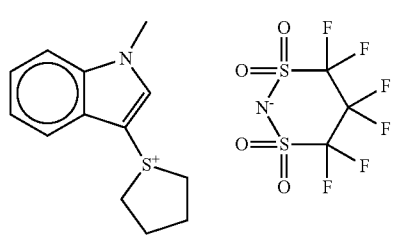
(C62)
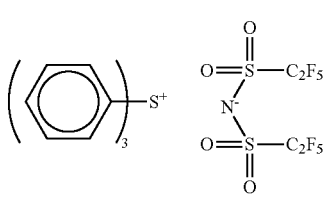
(C63)
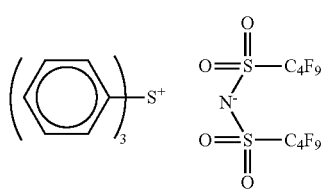
(C64)
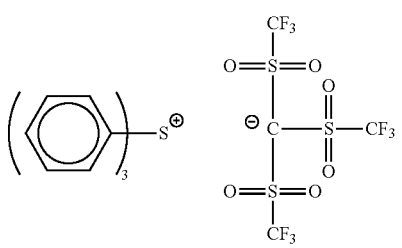

-continued (C65)

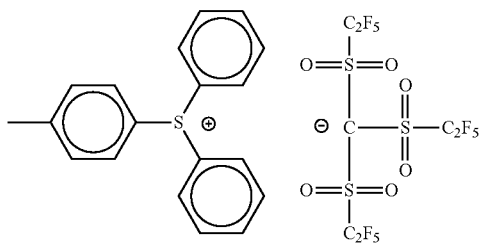

(C66)

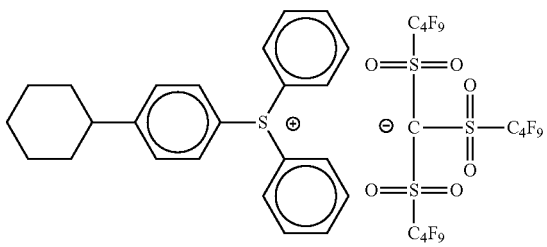

(C67)

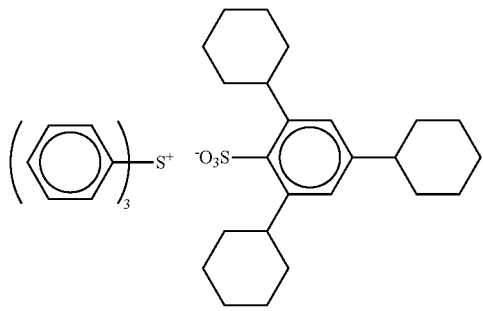

(C68)

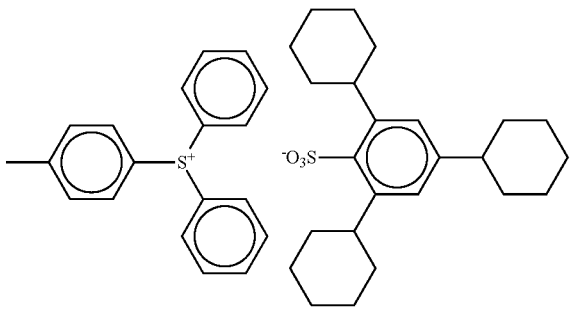

(C69)

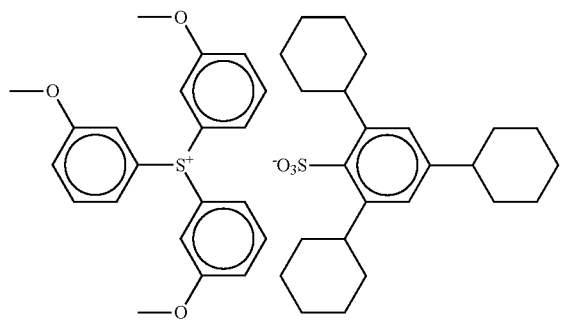

(C70)

(C71)

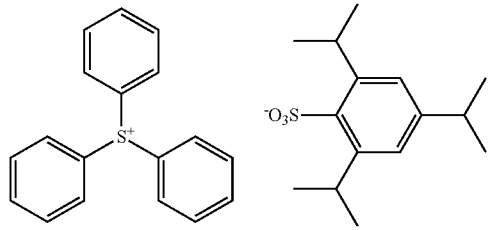

As for the acid generator (C), one kind of a compound may be used alone, or two or more kinds of compounds may be used in combination. In the case of using two or more kinds of compounds in combination, two or more kinds of compounds capable of generating organic acids differing in the number of all atoms excluding hydrogen atom by 2 or more are preferably combined.

The content of the acid generator (C) in the composition is preferably from 1 to 30 mass %, more preferably from 5 to 25 mass %, still more preferably from 8 to 20 mass %, based on the entire solid content of the resist composition.

[4] (D) Basic Compound

The negative resist composition of the present invention preferably contains a basic compound.

The basic compound is preferably a nitrogen-containing organic basic compound.

The usable compound is not particularly limited, but, for example, compounds classified into the following (1) to (4) are preferably used.

(1) Compound Represented by the Following Formula (BS-1):

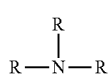

(BS-1)

In formula (BS-1), each R independently represents any of a hydrogen atom, an alkyl group (linear or branched), a cycloalkyl group (monocyclic or polycyclic), an aryl group and an aralkyl group, but it is not allowed that three R all are a hydrogen atom.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples of the aryl group include a phenyl group and a naphthyl group.

The carbon number of the aralkyl group as R is not particularly limited but is usually from 7 to 20, preferably from 7 to 11. Specific examples of the aralkyl group include a benzyl group.

In the alkyl group, cycloalkyl group, aryl group and aralkyl group as R, a hydrogen atom may be replaced by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group.

In the compound represented by formula (BS-1), it is preferred that only one of three R is a hydrogen atom or all R are not a hydrogen atom.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecyl amine, didecylamine, methyloctadecylamine, dimethylundecyl amine, N,N-dimethyldodecylamine, methyldioctadecylamine, N,N-dibutylaniline, N,N-dihexylaniline, 2,6-diisopropylaniline and 2,4,6-tri(tert-butyl)aniline.

Also, one preferred embodiment is a compound where in formula (BS-1), at least one R is an alkyl group substituted with a hydroxyl group. Specific examples of the compound include triethanolamine and N,N-dihydroxyethylaniline.

The alkyl group as R may contain an oxygen atom in the alkyl chain to form an alkyleneoxy chain. The alkyleneoxy chain is preferably —CH$_2$CH$_2$O—. Specific examples thereof include tris(methoxyethoxyethyl)amine and compounds illustrated in column 3, line 60 et seq. in the specification of U.S. Pat. No. 6,040,112.

(2) Compound Having a Nitrogen-Containing Heterocyclic Structure

The heterocyclic structure may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl) sebacate), a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group of an amine compound has a phenoxy group at the terminal opposite the nitrogen atom. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

A compound having at least one alkyleneoxy chain between the phenoxy group and the nitrogen atom is preferred. The number of alkyleneoxy chains per molecule is preferably from 3 to 9, more preferably from 4 to 6. Among alkyleneoxy chains, —CH$_2$CH$_2$O— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] in the specification of U.S. Patent Application Publication No. 2007/0224539A1.

(4) Ammonium Salt

An ammonium salt may also be appropriately used. The ammonium salt is preferably a hydroxide or a carboxylate. More specifically, a tetraalkylammonium hydroxide typified by tetrabutylammonium hydroxide is preferred. In addition, ammonium salts derived from amines of (1) to (3) above may be also used.

Other examples of the basic compound which can be used in the composition of the present invention include compounds synthesized in Examples of JP-A-2002-363146 and compounds described in paragraph 0108 of JP-A-2007-298569.

As for the basic compound, one kind of a compound is used alone, or two or more kinds of compounds are used in combination.

The amount of the basic compound used is usually from 0.001 to 10 mass %, preferably from 0.01 to 5 mass %, based on the solid content of the composition.

The molar ratio of acid generator/basic compound is preferably from 2 to 300. That is, the molar ratio is preferably 2 or more in view of sensitivity and resolution and is preferably 300 or less from the standpoint of suppressing the reduction in resolution due to thickening of the pattern with aging after exposure until heat treatment. The molar ratio is more preferably from 3 to 200, still more preferably from 4 to 150.

[5] Surfactant

The composition of the present invention may further contain a surfactant. In the case of containing a surfactant, the surfactant is preferably a fluorine-containing and/or silicon-containing surfactant.

Examples of the surfactant above include Megaface F176 and Megaface R08 produced by DIC Corporation; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may be also used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. in the specification of U.S. Patent Application Publication No. 2008/0248425A1.

One kind of a surfactant may be used alone, or two or more kinds of surfactants may be used in combination.

The amount of the surfactant used is preferably from 0 to 2 mass %, more preferably from 0.0001 to 2 mass %, still more preferably from 0.0005 to 0.5 mass %, based on the entire solid content (the entire amount excluding the solvent) of the negative resist composition.

[6] Resist Solvent

The solvent which can be used in preparing the composition are not particularly limited as long as it can dissolve respective components, and examples of the solvent include an alkylene glycol monoalkyl ether carboxylate (e.g., propylene glycol monomethyl ether acetate (PGMEA; 1-methoxy- 2-acetoxypropane)), an alkylene glycol monoalkyl ether (e.g., propylene glycol monomethyl ether (PGME; 1-methoxy-2-propanol)), an alkyl lactate (e.g., ethyl lactate, methyl lactate), a cyclic lactone (e.g., γ-butyrolactone, preferably having a carbon number of 4 to 10), a chain or cyclic ketone (e.g., 2-heptanone, cyclohexanone, preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (e.g., ethyl ethoxypropionate). Other examples of the usable solvent include the solvents described in paragraph [0244] et seq. in the specification of U.S. Patent Application Publication No. 2008/0248425A1.

Among these solvents, an alkylene glycol monoalkyl ether carboxylate and an alkylene glycol monoalkyl ether are preferred.

One of these solvents may be used alone, or two or more thereof may be mixed and used. In the case of mixing two or more solvents, it is preferred to mix a solvent having a hydroxyl group and a solvent not having a hydroxyl group. The mass ratio between the solvent having a hydroxyl group and the solvent not having a hydroxyl group is usually from 1/99 to 99/1, preferably from 10/90 to 90/10, more preferably from 20/80 to 60/40.

The solvent having a hydroxyl group is preferably an alkylene glycol monoalkyl ether, and the solvent not having a hydroxyl group is preferably an alkylene glycol monoalkyl ether carboxylate.

The amount used of the solvent based on the entire amount of the composition of the present invention may be appropriately adjusted according to the desired film thickness or the like, but in general, the amount used is adjusted such that the entire solid content concentration of the composition becomes from 0.5 to 30 mass %, preferably from 0.7 to 20 mass %, more preferably from 1.0 to 10 mass %, still more preferably from 1.2 to 5 mass %.

[7] Other Additives

Other than the above-described components, the composition of the invention may appropriately contain an onium carboxylate, a dissolution inhibiting compound having a molecular weight of 3,000 or less described, for example, in Proceeding of SPIE, 2724, 355 (1996), a dye, a plasticizer, a photosensitizer, a light absorber, an antioxidant and the like. Also, in the case of using EUV as the exposure light source, the composition may contain an additive capable of absorbing out-of-band light. Examples of the out-of-band light absorber include the aromatic compounds described in U.S. Patent Application Publication No. 2006/0223000.

EXAMPLES

The present invention is described below by referring to Examples, but the present invention should not be construed as being limited thereto.

Synthesis Example 1

Synthesis of Polymer-3

In 120 mL of tetrahydrofuran (THF), 20 g of poly(p-hydroxystyrene) (VP2500) produced by Nippon Soda Co., Ltd. was dissolved, and 4.96 g of 1-adamantanecarbonyl chloride and 3.37 g of triethylamine were added thereto. The mixture was stirred at 50° C. for 4 hours, and the reaction solution was returned to room temperature. Thereafter, 100 mL of ethyl acetate and 100 mL of distilled water were added thereto and while stirring the reaction solution in ice water, an aqueous 1 N HCl solution was added little by little to the reaction solution to effect neutralization. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and added dropwise to 2 L of hexane. The powder after filtration was collected and vacuum-dried to obtain 20.6 g of a polymer compound (Polymer-3).

Polymer-1 and Polymer-2 show in Table 1 below were also prepared.

[Resist Compositions 1 to 7]

The polymer compound (A) shown in Table 1 below and respective components shown in Table 2 below were dissolved in the solvent shown in Table 2, and the obtained solution was filtered by using a polyethylene filter having a pore size of 0.1 μm.

TABLE 1

| Polymer Compound (A) | | | | |
|---|---|---|---|---|
| | Structure | Compositional Ratio (molar ratio) | Mass Average Molecular Weight | Polydispersity |
| Polymer-1 | [structure with phenol OH] | — | 4100 | 1.2 |
| Polymer-2 | [structure with phenol OH] | — | 2600 | 1.1 |
| Polymer-3 | [copolymer structure with phenol OH and adamantanecarbonyloxy phenyl] | 90/10 | 3500 | 1.1 |

Polymer-1: MHS4000, produced by Nippon Soda Co., Ltd.
Polymer-2: VP2500, produced by Nippon Soda Co., Ltd.

TABLE 2

| | Polymer Compound (A) | | Crosslinking Agent (B) | | Acid Generator (C) | | Basic Compound (D) | Surfactant | Resist Solvent | | |
|---|---|---|---|---|---|---|---|---|---|---|---|
| Composition 1 | Polymer-1 0.7 g | | XLinker-1 0.2 g | | PAG-1 0.08 g | | TBAH 0.02 g | W-1 0.005 g | PGMEA 60 g | PGME 15 g | |
| Composition 2 | Polymer-1 0.67 g | | XLinker-1 0.2 g | | PAG-1 0.1 g | | TBAH 0.03 g | W-1 0.005 g | PGMEA 30 g | PGME 30 g | EL 15 g |
| Composition 3 | Polymer-1 0.635 g | | XLinker-2 0.2 g | | PAG-1 0.12 g | | TBAH 0.045 g | W-2 0.005 g | PGMEA 30 g | PGME 30 g | EL 15 g |
| Composition 4 | Polymer-2 0.68 g | | XLinker-1 0.1 g | XLinker-3 0.1 g | PAG-1 0.1 g | | TBAH 0.02 g | W-1 0.005 g | PGMEA 60 g | PGME 15 g | |
| Composition 5 | Polymer-1 0.34 g | Polymer-3 0.34 g | XLinker-1 0.2 g | | PAG-1 0.05 g | PAG-3 0.05 g | TBAH 0.02 g | W-1 0.005 g | PGMEA 60 g | PGME 15 g | |
| Composition 6 | Polymer-1 0.78 g | | XLinker-4 0.1 g | | PAG-1 0.1 g | | TBAH 0.02 g | W-1 0.005 g | PGMEA 60 g | PGME 15 g | |
| Composition 7 | Polymer-1 0.78 g | | XLinker-5 0.1 g | | PAG-2 0.1 g | | TBAH 0.02 g | W-1 0.005 g | PGMEA 60 g | PGME 15 g | |

Details of respective components denoted in abbreviations in Table 2 are given below.

<Crosslinking Agent (B)>

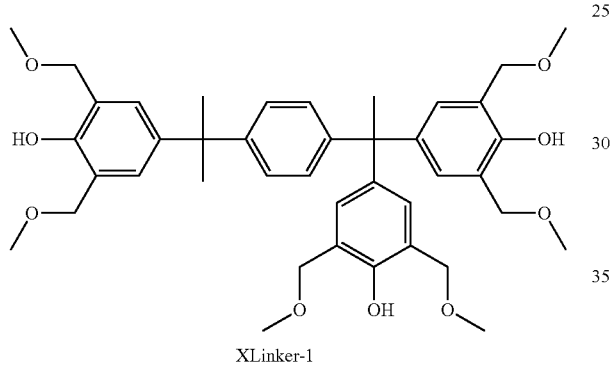

XLinker-1

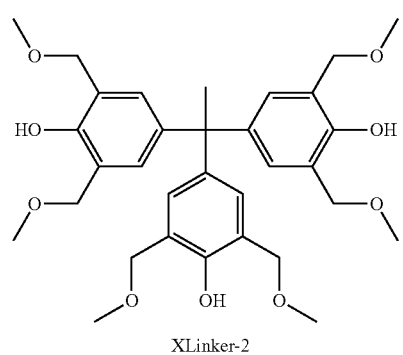

XLinker-2

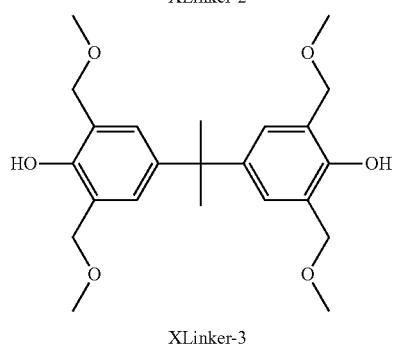

XLinker-3

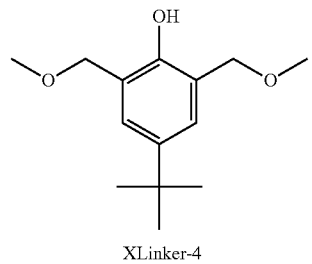

XLinker-4

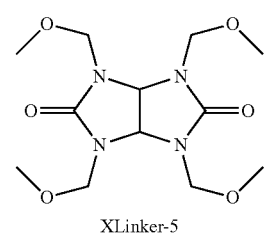

XLinker-5

<Acid Generator (C)>

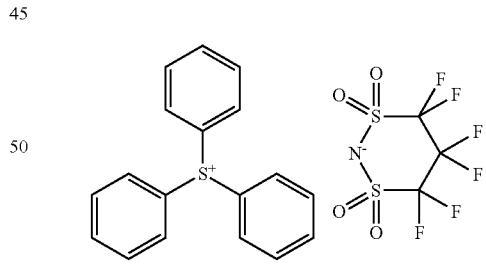

PAG-1

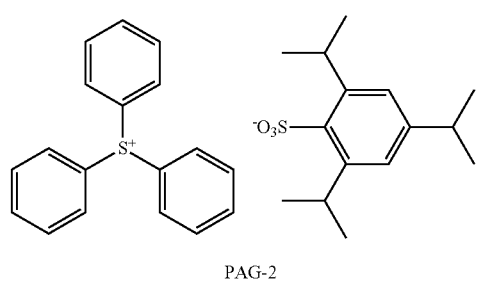

PAG-2

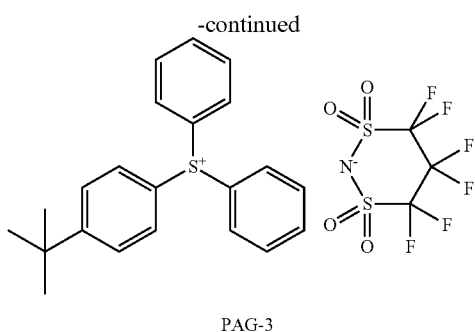

PAG-3

<Basic Compound (D)>
TBAH: Tetrabutylammonium hydroxide
<Surfactant>
W-1: PF6320 (produced by OMNOVA)
W-2: Megaface F176 (produced by DIC Corporation)
<Solvent>
PGMEA: Propylene glycol monomethyl ether acetate
PGME: Propylene glycol monomethyl ether
EL: Ethyl lactate EB Exposure Evaluation 1

Examples 1 to 12 and Comparative Examples 1 to 4

Resist patterns were formed using Compositions 1 to 7 by the following operation. The details of the conditions for resist pattern formation are shown in Table 3.
[Coating of Resist]
The negative resist solution prepared was uniformly applied on a hexamethyldisilazane-treated silicon substrate by using a spin coater and dried by heating on a hot plate under the conditions shown in Table 3. Incidentally, the thickness of the coating film shown in Table 3 is the film thickness after drying by heating.
[Exposure]
The resist film was exposed to a line pattern (length direction: 0.5 mm, number of lines drawn: 40) with a line width of 20 to 30 nm in steps of 2.5 nm by using an electron beam irradiation apparatus (JBX6000, manufactured by JEOL, accelerating voltage: 50 keV) while varying the irradiation dose.
[Post-Exposure Baking]
Immediately after the irradiation, the resist film was heated on a hot plate under the conditions shown in Table 3.

[Development]
1. Shower Development
Using a shower-type developing apparatus (ADE3000S, manufactured by ACTES), development was performed by spraying and ejecting the alkali developer (23° C.) shown in Table 3 at a flow rate of 200 mL/min for the time shown in Table 3 while rotating the wafer at 50 revolutions (rpm).
Thereafter, a rinsing treatment was performed by spraying and ejecting pure water used as the rinsing solution (23° C.) at a flow rate of 200 mL/min for 30 seconds while rotating the wafer at 50 revolutions (rpm).
Finally, the wafer was dried by high-speed spinning at 2,500 revolutions (rpm) for 60 seconds.
2. Puddle Development
Using a shower-type developing apparatus (ADE3000S, manufactured by ACTES), the alkali developer (23° C.) shown in Table 3 was sprayed and ejected at a flow rate of 200 mL/min for 5 seconds while rotating the wafer at 50 revolutions (rpm), to raise the developer on the wafer. Subsequently, rotation of the wafer was stopped, and development was performed by leaving the wafer to stand still for the time shown in Table 3.
Thereafter, a rinsing treatment was performed by spraying and ejecting pure water used as the rinsing solution (23° C.) at a flow rate of 200 mL/min for 30 seconds while rotating the wafer at 50 revolutions (rpm).
The alkali development time shown in Table 3 was determined by the following method.
The composition shown in Table 2 was uniformly applied on a hexamethyldisilazane-treated silicon substrate by using a spin coater and dried by heating on a hot plate under the conditions shown in Table 3 to prepare a wafer coated with a composition.
Subsequently, the wafer was developed under the conditions shown in Table 3 and after the completion of development, the film thickness of the wafer was measured. The development time required when the alkali developer was used in each concentration was determined by rating that the wafer with remaining of the resist was B and the wafer without remaining of the resist was A. As Reference Example, the results at determining the development time described in Example 3 are shown in Table 4.
Incidentally, in Table 3, the amount added shown in the column of Other Additives is the value in terms of mass % based on the entire mass of the alkali developer. Also, in the Tables below, TMAH means an aqueous tetramethylammonium hydroxide solution, and Surfynol 440 means Surfynol 440 (produced by Nissin Chemical Industry Co., Ltd.).

TABLE 3

| | Composition | Thickness of Resist Film Coated | Baking Conditions | | Developer | | | | |
| | | | After Coating | After Exposure | Alkali Species | Alkali Concentration (mass %) | Other Additives | Mode of Development | Development Time |
|---|---|---|---|---|---|---|---|---|---|
| Example 1 | Composition 1 | 30 nm | 150° C. × 90 sec | 110° C. × 90 sec | TMAH | 1.0% | Surfynol 440 (0.02%) | shower | 120 sec |
| Example 2 | Composition 1 | 30 nm | 150° C. × 90 sec | 110° C. × 90 sec | TMAH | 1.0% | | shower | 120 sec |
| Example 3 | Composition 1 | 30 nm | 150° C. × 90 sec | 110° C. × 90 sec | TMAH | 0.8% | | shower | 180 sec |
| Example 4 | Composition 2 | 30 nm | 150° C. × 90 sec | 110° C. × 90 sec | TMAH | 0.8% | | shower | 180 sec |
| Example 5 | Composition 3 | 30 nm | 150° C. × 90 sec | 110° C. × 90 sec | TMAH | 0.8% | Isopropyl alcohol (10%) | shower | 180 sec |
| Example 6 | Composition 1 | 25 nm | 150° C. × 90 sec | 110° C. × 90 sec | TMAH | 0.6% | | shower | 300 sec |
| Example 7 | Composition 1 | 20 nm | 150° C. × 90 sec | 110° C. × 90 sec | TMAH | 0.5% | | shower | 500 sec |

TABLE 3-continued

| | | Thickness of Resist Film Coated | Baking Conditions | | Developer | | | | |
| | Composition | | After Coating | After Exposure | Alkali Species | Alkali Concentration (mass %) | Other Additives | Mode of Development | Development Time |
|---|---|---|---|---|---|---|---|---|---|
| Example 8 | Composition 1 | 30 nm | 150° C. × 90 sec | 110° C. × 90 sec | TMAH | 1.1% | | shower | 90 sec |
| Example 9 | Composition 4 | 40 nm | 150° C. × 90 sec | 110° C. × 90 sec | TMAH | 1.0% | | puddle | 180 sec |
| Example 10 | Composition 5 | 30 nm | 150° C. × 90 sec | 110° C. × 90 sec | TMAH | 1.0% | | shower | 150 sec |
| Example 11 | Composition 6 | 30 nm | 150° C. × 90 sec | 120° C. × 90 sec | TMAH | 1.0% | | shower | 180 sec |
| Example 12 | Composition 7 | 30 nm | 150° C. × 90 sec | 110° C. × 90 sec | TMAH | 1.0% | | shower | 100 sec |
| Comparative Example 1 | Composition 1 | 50 nm | 150° C. × 90 sec | 110° C. × 90 sec | TMAH | 1.0% | | shower | 100 sec |
| Comparative Example 2 | Composition 1 | 50 nm | 150° C. × 90 sec | 110° C. × 90 sec | TMAH | 0.8% | | shower | 180 sec |
| Comparative Example 3 | Composition 1 | 30 nm | 150° C. × 90 sec | 110° C. × 90 sec | TMAH | 2.38% | | puddle | 30 sec |
| Comparative Example 4 | Composition 1 | 30 nm | 150° C. × 90 sec | 110° C. × 90 sec | TMAH | 0.3% | | shower | 1000 sec |

TABLE 4

(Reference Example: Method for Determining Development Time)

| Composition | Film Thickness | Alkali Species | Alkali Concentration (mass %) | Mode of Development | Development Time | Presence or Absence of Resist after Development | Development Time Required |
|---|---|---|---|---|---|---|---|
| Composition 1 | 30 nm | TMAH | 0.8% | shower | 120 sec | B | 180 sec |
| | | TMAH | 0.8% | shower | 150 sec | B | |
| | | TMAH | 0.8% | shower | 180 sec | A | |

The resist pattern was evaluated for the following items. Details of the results are shown in Table 5.

[Sensitivity]

The obtained pattern was observed by using a scanning electron microscope (S-9220, manufactured by Hitachi, Ltd.). The irradiation energy when separately resolving line and space at a ratio of 1:1 for a line width of 30 nm was taken as the sensitivity ($\mu C/cm^2$).

[Resolution]

The minimum line width below which the line and space are not separately resolved at a ratio of 1:1 was taken as the resolution (nm).

[Line Edge Roughness (LER)]

At arbitrary 30 points in the longitudinal 1 μm region of a line pattern with a line width of 30 nm, the distance from the reference line where the edge should be present was measured using a scanning electron microscope (S-9220, manufactured by Hitachi, Ltd.), and after determining the standard deviation, 3σ was computed. A smaller value indicates better performance in terms of line edge roughness.

[Pattern Profile]

The profile of the pattern with a line width of 30 nm at the irradiation dose giving the sensitivity above was observed using an electron microscope (S-4800, manufactured by Hitachi, Ltd.), and the pattern rated A when the profile is close to rectangle and otherwise, rated B or C depending on the degree. The results are shown with comments on the profile.

TABLE 5

| | Sensitivity ($\mu C/cm^2$) | Resolution (nm) | LER (nm) | Pattern Profile |
|---|---|---|---|---|
| Example 1 | 110 | 20 | 3.5 | A |
| Example 2 | 100 | 20 | 3.5 | A |
| Example 3 | 90 | 20 | 3.4 | A |
| Example 4 | 90 | 20 | 3.2 | A |
| Example 5 | 90 | 20 | 3.2 | A |
| Example 6 | 80 | 20 | 3.5 | A |
| Example 7 | 70 | 20 | 3.5 | B (slight residue in space part) |
| Example 8 | 95 | 20 | 5.0 | A |
| Example 9 | 100 | 22.5 | 4.5 | B (slight residue in space part) |
| Example 10 | 100 | 22.5 | 4.5 | A |
| Example 11 | 100 | 25 | 5.5 | A |
| Example 12 | 100 | 25 | 6.5 | B (slight residue in space part) |
| Comparative Example 1 | 100 | 27.5 | 7.0 | C (collapse) |
| Comparative Example 2 | 90 | 27.5 | 7.0 | C (collapse) |
| Comparative Example 3 | 130 | 30 | 7.0 | C (film loss) |
| Comparative Example 4 | 65 | 22.5 | 4.5 | C (a large amount of residue in space part) |

It is seen from the results in Table 5 that the resist pattern forming method according to the present invention can satisfy high sensitivity, high resolution, small line edge roughness (LER) and excellent pattern profile all at the same time.

EB Exposure Evaluation 2

Examples 13 to 15

Resist patterns were formed and evaluated by the same operation as in EB Exposure Evaluation 1 except for applying the prepared negative resist solution on a Cr oxide film-deposited 6-inch wafer. The conditions for pattern formation and the evaluation results of each pattern are shown in Tables 6 and 7.

TABLE 6

|  | Composition | Thickness of Resist Film Coated | Baking Conditions | | Developer | | | |
|---|---|---|---|---|---|---|---|---|
|  |  |  | After Coating | After Exposure | Alkali Species | Alkali Concentration (mass %) | Mode of Development | Development Time |
| Example 13 | Composition 1 | 30 nm | 150° C. × 90 sec | 110° C. × 90 sec | TMAH | 1.0% | shower | 120 sec |
| Example 14 | Composition 2 | 30 nm | 150° C. × 90 sec | 110° C. × 90 sec | TMAH | 0.8% | shower | 180 sec |
| Example 15 | Composition 1 | 30 nm | 150° C. × 90 sec | 110° C. × 90 sec | TMAH | 0.6% | shower | 500 sec |

TABLE 7

|  | Sensitivity ($\mu C/cm^2$) | Resolution (nm) | LER (nm) | Pattern Profile |
|---|---|---|---|---|
| Example 13 | 100 | 20 | 4.5 | A |
| Example 14 | 90 | 20 | 4.2 | A |
| Example 15 | 80 | 20 | 4.0 | A |

It is seen from the results in Table 7 that the resist pattern forming method according to the present invention is applicable also to the production of a nanoimprint mold or a photomask.

EUV Exposure Evaluation 1

Examples 16 to 18

Exposure was performed using EUV light (wavelength: 13 nm) through a 1:1 line-and-space mask pattern with a line width of 30 nm. Coating of resist and development were performed by the same operation as in EB Exposure Evaluation 1, and the formed resist pattern was subjected to the same evaluations except for resolution. The conditions for pattern formation and the evaluation results of each pattern are shown in Tables 8 and 9.

TABLE 9

|  | Sensitivity ($mJ/cm^2$) | LER (nm) | Pattern Profile |
|---|---|---|---|
| Example 16 | 25 | 4.5 | A |
| Example 17 | 24 | 4.2 | A |
| Example 18 | 24 | 4.0 | A |

It is seen from the results in Table 9 that also in the case of using EUV light (wavelength: 13 nm), the resist pattern forming method according to the present invention can satisfy high sensitivity, small line edge roughness (LER) and excellent pattern profile all at the same time.

According to the present invention, a resist pattern forming method capable of forming a pattern satisfying high resolution performance (for example, high resolution and small line edge roughness (LER)) enabling resolution of an ultrafine (for example, a 1:1 line-and-space with a line width of 30 nm or less) pattern, excellent pattern profile and high sensitivity all at the same time, a resist pattern, a crosslinkable negative resist composition, a nanoimprint mold and a photomask can be provided.

This application is based on Japanese patent application JP 2011-180893, filed on Aug. 22, 2011, the entire content of which is hereby incorporated by reference, the same as if set forth at length.

What is claimed is:

1. A resist pattern forming method, comprising: in the following order,
   (1) a step of forming a film on a substrate by using a negative resist composition capable of undergoing negative conversion by a crosslinking reaction;
   (2) a step of exposing the film; and
   (4) a step of performing development by using an alkali developer after the exposing, wherein
   the negative resist composition contains (A) a polymer compound having a repeating unit represented by the following formula (I),

TABLE 8

|  | Composition | Thickness of Resist Film Coated | Baking Conditions | | Developer | | | |
|---|---|---|---|---|---|---|---|---|
|  |  |  | After Coating | After Exposure | Alkali Species | Alkali Concentration (mass %) | Mode of Development | Development Time |
| Example 16 | Composition 1 | 30 nm | 150° C. × 90 sec | 110° C. × 90 sec | TMAH | 1.0% | shower | 120 sec |
| Example 17 | Composition 2 | 30 nm | 150° C. × 90 sec | 110° C. × 90 sec | TMAH | 0.8% | shower | 180 sec |
| Example 18 | Composition 1 | 30 nm | 150° C. × 90 sec | 110° C. × 90 sec | TMAH | 0.7% | shower | 500 sec | a thickness of the film formed in the step (1) is from 15 to 40 nm, and an alkali component concentration in the alkali developer is from 0.6 to 1.1 mass %:

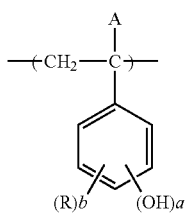
(I)

wherein A represents a hydrogen atom, an alkyl group, a cycloalkyl group, a halogen atom or a cyano group;

R represents a halogen atom, an alkyl group, a cycloalkyl group, an aryl group, an alkenyl group, an aralkyl group, an alkoxy group, an alkylcarbonyloxy group or an alkylsulfonyloxy group, and when a plurality of R's are present, each R may be the same as or different from every other R or a plurality of R's may combine together to form a ring;

a represents an integer of 1 to 3; and b represents an integer of 0 to (3-a);

wherein the polymer compound (A) contains a repeating unit represented by formula (VI):

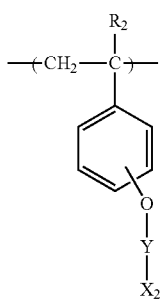
(VI)

wherein $R_2$ represents a hydrogen atom or a methyl group, Y represents a single bond or a divalent linking group, and $X_2$ represents a non-acid-decomposable polycyclic alicyclic hydrocarbon group.

2. The resist pattern forming method according to claim 1, wherein in the development step (4), the development is performed by continuously supplying a substantially fresh alkali developer.

3. The resist pattern forming method according to claim 2, wherein the development is a shower development conducted by a spray method.

4. The resist pattern forming method according to claim 1, wherein in the repeating unit represented by formula (I), —OH is present on at least one meta-position of a benzene ring with respect to a bond from a main chain of the polymer compound (A).

5. The resist pattern forming method according to claim 1, wherein the alkali developer used in the development step (4) is an aqueous solution containing tetramethylammonium hydroxide.

6. The resist pattern forming method according to claim 1, further comprising:
(3) a baking step between the exposure step (2) and the development step (4).

7. The resist pattern forming method according to claim 1, wherein the exposing in the exposure step (2) is performed by an electron beam or EUV light.

8. The resist pattern forming method according to claim 1, wherein the negative resist composition used in the film forming step (1) further contains (B) a crosslinking agent capable of crosslinking with the polymer compound (A) by an action of an acid, (C) a compound capable of generating an acid upon irradiation with an actinic ray or radiation and (D) a basic compound.

9. The resist pattern forming method according to claim 8, wherein the crosslinking agent (B) is a phenolic compound having two or more benzene rings within a molecule.

10. The resist pattern forming method according to claim 1, wherein the alkali component concentration in the alkali developer is from 0.6 to 1.0 mass %.

11. The resist pattern forming method according to claim 1, wherein $X_2$ is an adamantyl group, a decalin group, a norbornyl group, a cedrol group, a bicyclohexyl group, a bicycloheptyl group, a bicyclooctyl group, a bicyclodecanyl group, a bicyclododecanyl group or a tricyclodecanyl group.

12. The resist pattern forming method according to claim 1, wherein the negative resist composition further contains a basic compound, and a fluorine-containing and/or silicon-containing surfactant.

13. A resist pattern, which is formed by the resist pattern forming method according to claim 1.

* * * * *